US010103465B2

(12) United States Patent
Amini et al.

(10) Patent No.: US 10,103,465 B2
(45) Date of Patent: Oct. 16, 2018

(54) CONNECTOR RECEPTACLE HAVING A TONGUE

(71) Applicant: Apple Inc., Cupertino, CA (US)

(72) Inventors: Mahmoud R. Amini, Sunnyvale, CA (US); Zheng Gao, San Jose, CA (US); Nathan N. Ng, Fremont, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 15/482,830

(22) Filed: Apr. 10, 2017

(65) Prior Publication Data

US 2017/0338577 A1    Nov. 23, 2017

Related U.S. Application Data

(63) Continuation of application No. 14/543,748, filed on Nov. 17, 2014, now Pat. No. 9,640,885.
(Continued)

(51) Int. Cl.
*H01R 24/00*    (2011.01)
*H01R 12/73*    (2011.01)
(Continued)

(52) U.S. Cl.
CPC ......... *H01R 12/73* (2013.01); *H01R 12/7029* (2013.01); *H01R 13/6583* (2013.01);
(Continued)

(58) Field of Classification Search
CPC .......................... H01R 12/73; H01R 12/7029; H01R 13/6583; H01R 13/6658
(Continued)

(56) References Cited

U.S. PATENT DOCUMENTS 3,128,138 A    4/1964 Noschese
3,587,029 A    6/1971 Knowles
(Continued)

FOREIGN PATENT DOCUMENTS

CN    101882726    10/2010
CN    101908679    12/2010
(Continued)

OTHER PUBLICATIONS

Office Action dated Sep. 25, 2017 in U.S. Appl. No. 15/396,640, 17 pages.
(Continued)

*Primary Examiner* — Tulsidas C Patel
*Assistant Examiner* — Peter G Leigh
(74) *Attorney, Agent, or Firm* — Kilpatrick Townsend & Stockton, LLP

(57) ABSTRACT

Connector systems may include a connector receptacle and connector plug or insert. The connector receptacle may include a tongue. The tongue may be formed using a printed circuit board. Contacts may be plated on top and bottom surfaces of the tongue. Retention features may also be located on top and bottom surfaces of tongue. These retention features may be speed bumps or other features. The connector insert may include a leading edge portion formed of plastic, a conductive shield around the insert behind the leasing edge portion, a plurality of spring contacts attached to an inside of the conductive shield, a top row of contacts; and a bottom row of contacts. Other connector receptacles may include a tongue having side ground contacts. The side ground contacts may engage an inside of a plug shield and have contacting portion to fit in openings in the plug shield.

22 Claims, 37 Drawing Sheets

Related U.S. Application Data

(60) Provisional application No. 61/905,278, filed on Nov. 17, 2013, provisional application No. 61/918,608, filed on Dec. 19, 2013, provisional application No. 61/922,849, filed on Jan. 1, 2014, provisional application No. 62/003,022, filed on May 26, 2014.

(51) Int. Cl.
  *H01R 12/70* (2011.01)
  *H01R 13/6583* (2011.01)
  *H01R 24/60* (2011.01)
  *H01R 24/66* (2011.01)
  *H01R 13/66* (2006.01)
  *H05K 1/02* (2006.01)
  *H05K 1/11* (2006.01)

(52) U.S. Cl.
  CPC ............ *H01R 24/60* (2013.01); *H01R 24/66* (2013.01); *H01R 13/6658* (2013.01); *H05K 1/0215* (2013.01); *H05K 1/117* (2013.01)

(58) Field of Classification Search
  USPC ......................................... 439/660, 357, 358
  See application file for complete search history.

(56) References Cited

U.S. PATENT DOCUMENTS

| | | |
|---|---|---|
| 4,337,989 A | 7/1982 | Asick et al. |
| 4,389,080 A | 6/1983 | Clark et al. |
| 4,544,227 A | 10/1985 | Hirose |
| 4,571,012 A | 2/1986 | Bassler et al. |
| 4,684,192 A | 8/1987 | Long et al. |
| 4,808,118 A | 2/1989 | Wilson et al. |
| 4,875,881 A | 10/1989 | Caveny et al. |
| 4,950,184 A | 8/1990 | Caveney et al. |
| 5,037,315 A | 8/1991 | Collier |
| 5,145,385 A | 9/1992 | Takano |
| 5,164,880 A | 11/1992 | Cronin |
| 5,221,212 A | 6/1993 | Davis |
| 5,318,452 A | 6/1994 | Fortuna et al. |
| 5,382,179 A | 1/1995 | Noschese |
| 5,431,578 A | 7/1995 | Wayne |
| 5,586,911 A | 12/1996 | Miller |
| 5,591,050 A | 1/1997 | Sueoka |
| 5,622,522 A | 4/1997 | Tan et al. |
| 5,674,085 A | 10/1997 | Davis et al. |
| 5,788,516 A | 8/1998 | Uggmark |
| 5,913,690 A | 6/1999 | Dechelette et al. |
| 5,975,935 A | 11/1999 | Yamaguchi et al. |
| 5,975,957 A | 11/1999 | Noda et al. |
| 5,997,349 A | 12/1999 | Yoshioka |
| 6,019,616 A | 2/2000 | Yagi et al. |
| 6,039,583 A | 3/2000 | Korsunsky et al. |
| 6,042,424 A | 3/2000 | LaCoy et al. |
| 6,162,089 A | 12/2000 | Jacobson et al. |
| 6,203,333 B1 * | 3/2001 | Medina ............... H01R 13/6658 439/465 |
| 6,273,749 B1 | 8/2001 | Yang |
| 6,287,147 B1 | 9/2001 | Lin |
| 6,305,978 B1 | 10/2001 | Ko |
| 6,338,652 B1 | 1/2002 | Ko |
| 6,447,311 B1 | 9/2002 | Hu et al. |
| 6,565,366 B1 * | 5/2003 | Wu ....................... H01R 13/627 439/607.13 |
| 6,685,486 B1 | 2/2004 | Zhang et al. |
| 6,736,676 B2 | 5/2004 | Zhang et al. |
| 6,755,689 B2 | 6/2004 | Chu et al. |
| 6,840,806 B2 | 1/2005 | Kodama et al. |
| 6,913,485 B2 | 7/2005 | Ko et al. |
| 6,926,557 B1 | 8/2005 | Yamaguchi et al. |
| 6,981,887 B1 * | 1/2006 | Mese ....................... H01R 29/00 439/244 |
| 6,984,150 B2 * | 1/2006 | Kondou ............... H01R 13/405 439/497 |
| 7,052,287 B1 | 5/2006 | Ni et al. |
| 7,074,052 B1 | 7/2006 | Ni et al. |
| 7,086,889 B2 | 8/2006 | Yin et al. |
| 7,086,901 B2 | 8/2006 | Zhang et al. |
| 7,094,103 B2 | 8/2006 | Lai et al. |
| 7,128,588 B2 | 10/2006 | Hu et al. |
| 7,179,124 B2 | 2/2007 | Zhang et al. |
| 7,207,836 B2 | 4/2007 | Tsai et al. |
| 7,238,048 B2 | 7/2007 | Olson et al. |
| 7,269,004 B1 | 9/2007 | Ni et al. |
| 7,275,962 B1 * | 10/2007 | Yamakami ............ H01R 43/24 439/620.21 |
| 7,314,383 B1 | 1/2008 | Ho et al. |
| 7,364,464 B2 | 4/2008 | Shen et al. |
| 7,407,390 B1 | 8/2008 | Ni |
| 7,410,365 B2 * | 8/2008 | Wu ........................ H01R 13/512 439/358 |
| 7,445,452 B1 | 11/2008 | Wu |
| 7,462,071 B1 | 12/2008 | Wu |
| 7,466,556 B2 | 12/2008 | Hiew et al. |
| 7,497,737 B2 | 3/2009 | Mikolajczak et al. |
| 7,508,677 B2 * | 3/2009 | Ice ........................ G02B 6/4277 361/752 |
| 7,594,827 B2 * | 9/2009 | Takamoto ............... A63F 13/02 439/353 |
| 7,604,497 B2 | 10/2009 | Wu et al. |
| 7,658,617 B1 | 2/2010 | Brodsky et al. |
| 7,670,156 B2 | 3/2010 | Chen |
| 7,686,656 B2 | 3/2010 | He et al. |
| 7,690,947 B2 | 4/2010 | Gu et al. |
| 7,699,663 B1 | 4/2010 | Little et al. |
| 7,753,724 B2 | 7/2010 | Gong et al. |
| 7,837,506 B1 | 11/2010 | Chiang |
| 7,837,510 B1 | 11/2010 | Hung et al. |
| 7,841,905 B2 | 11/2010 | He et al. |
| 7,878,852 B2 | 2/2011 | Hiew et al. |
| 7,883,369 B1 * | 2/2011 | Sun ....................... H01R 12/7011 439/607.35 |
| 7,988,491 B2 | 8/2011 | Davis et al. |
| 7,997,909 B2 * | 8/2011 | Xu ........................ H01R 13/6594 439/607.57 |
| 8,007,318 B1 | 8/2011 | Dunwoody et al. |
| 8,011,948 B2 | 9/2011 | Wu |
| 8,011,950 B2 | 9/2011 | McGrath |
| 8,011,968 B2 | 9/2011 | Lai et al. |
| 8,047,875 B2 | 11/2011 | Yamakami |
| 8,052,476 B2 | 11/2011 | He et al. |
| 8,062,053 B2 | 11/2011 | Dooley et al. |
| 8,100,720 B2 | 1/2012 | Hsu et al. |
| 8,133,061 B1 | 3/2012 | Ayers, Sr. et al. |
| 8,147,272 B2 | 4/2012 | Rhein |
| 8,251,747 B2 | 8/2012 | He et al. |
| 8,298,009 B2 | 10/2012 | Elkhatib |
| 8,393,907 B2 | 3/2013 | Lin |
| 8,439,706 B2 * | 5/2013 | Sytsma ............ H01R 13/65802 439/607.19 |
| 8,454,381 B2 | 6/2013 | Wu |
| 8,475,218 B2 | 7/2013 | Zheng et al. |
| 8,476,110 B2 | 7/2013 | Lin |
| 8,506,317 B2 | 8/2013 | Bandhu et al. |
| 8,545,273 B1 | 10/2013 | Chen |
| 8,562,369 B2 * | 10/2013 | Wu ........................ H01R 9/032 439/345 |
| 8,567,050 B2 | 10/2013 | Hiew |
| 8,579,519 B2 * | 11/2013 | Wu ........................ G02B 6/3817 385/101 |
| 8,602,822 B2 * | 12/2013 | Siahaan ............ H01R 13/6581 29/857 |
| 8,662,933 B2 | 3/2014 | Wu et al. |
| 8,696,388 B2 | 4/2014 | Gao et al. |
| 8,708,718 B2 | 4/2014 | Li et al. |
| 8,708,752 B2 | 4/2014 | Wu |
| 8,747,147 B2 | 6/2014 | Yu et al. |
| 8,764,492 B2 | 7/2014 | Chiang |
| 8,777,664 B2 * | 7/2014 | Gui ...................... H01R 13/6471 439/607.25 |

(56) References Cited

U.S. PATENT DOCUMENTS

| | | |
|---|---|---|
| 8,794,981 B1 | 8/2014 | Rodriguez |
| 8,808,029 B2 | 8/2014 | Castillo |
| 8,808,030 B2 | 8/2014 | Gao et al. |
| 8,814,443 B2 | 8/2014 | He et al. |
| 8,814,599 B2 | 8/2014 | Wu et al. |
| 8,821,181 B1 | 9/2014 | Lam |
| 8,911,262 B1 | 12/2014 | Leiba et al. |
| 8,992,249 B2 | 3/2015 | Kobayashi et al. |
| 9,065,212 B2 | 6/2015 | Golko et al. |
| 9,065,229 B2 | 6/2015 | Yamaguchi |
| 9,276,340 B2 | 3/2016 | Amini |
| 9,281,608 B2 | 3/2016 | Zhao |
| 9,356,370 B2 | 5/2016 | Lee |
| 9,450,339 B2 | 9/2016 | Gao et al. |
| 9,496,653 B2 | 11/2016 | Little |
| 9,515,439 B2 | 12/2016 | Ng et al. |
| 9,614,310 B2 | 4/2017 | Tsai |
| 9,660,399 B2 | 5/2017 | Hsu |
| 2002/0001982 A1 | 1/2002 | Sakurada |
| 2002/0039857 A1* | 4/2002 | Naito ............ H01R 23/6873 439/493 |
| 2002/0142636 A1 | 10/2002 | Murr et al. |
| 2004/0198079 A1* | 10/2004 | Aronson ............ G02B 6/4201 439/76.1 |
| 2005/0026469 A1 | 2/2005 | Ice |
| 2006/0052005 A1 | 3/2006 | Zhang et al. |
| 2007/0072446 A1 | 3/2007 | Hashimoto et al. |
| 2007/0111600 A1 | 5/2007 | Tokunaga |
| 2007/0115682 A1 | 5/2007 | Roberts et al. |
| 2007/0254517 A1 | 11/2007 | Olson et al. |
| 2009/0023339 A1 | 1/2009 | Kameyama et al. |
| 2009/0042448 A1 | 2/2009 | He |
| 2010/0248544 A1 | 9/2010 | Xu |
| 2010/0267282 A1 | 10/2010 | Tsai |
| 2010/0303421 A1 | 12/2010 | He |
| 2011/0151688 A1 | 6/2011 | Beaman |
| 2011/0237134 A1 | 9/2011 | Gao |
| 2011/0300749 A1 | 12/2011 | Sytsma |
| 2012/0015561 A1* | 1/2012 | Tsai ............ H01R 24/60 439/660 |
| 2012/0030943 A1 | 2/2012 | Hiew et al. |
| 2012/0282808 A1 | 11/2012 | Luo |
| 2013/0005193 A1 | 1/2013 | Tsai |
| 2013/0045638 A1* | 2/2013 | Gui ............ H01R 13/6471 439/660 |
| 2013/0122752 A1 | 5/2013 | Lu |
| 2013/0164965 A1 | 6/2013 | Yin |
| 2013/0183862 A1 | 7/2013 | Ni |
| 2013/0217253 A1 | 8/2013 | Golko |
| 2013/0244492 A1 | 9/2013 | Golko |
| 2013/0288520 A1 | 10/2013 | Simmel |
| 2013/0288537 A1 | 10/2013 | Simmel |
| 2013/0330976 A1 | 12/2013 | Simmel |
| 2014/0024257 A1 | 1/2014 | Castillo et al. |
| 2014/0073183 A1 | 3/2014 | Golko |
| 2014/0078695 A1 | 3/2014 | Shih |
| 2014/0094066 A1 | 4/2014 | Do |
| 2014/0113493 A1 | 4/2014 | Funamura |
| 2014/0194005 A1 | 7/2014 | Little |
| 2014/0220827 A1 | 8/2014 | Hsu |
| 2014/0242848 A1 | 8/2014 | Golko |
| 2015/0031240 A1 | 1/2015 | Yang |
| 2015/0044886 A1 | 2/2015 | Little |
| 2015/0093936 A1 | 4/2015 | Little |
| 2015/0131245 A1 | 5/2015 | Amini et al. |
| 2015/0171562 A1 | 6/2015 | Gao et al. |
| 2015/0194772 A1 | 7/2015 | Little |
| 2015/0200493 A1 | 7/2015 | Gao et al. |
| 2015/0207279 A1 | 7/2015 | Little |
| 2015/0214673 A1 | 7/2015 | Gao et al. |
| 2015/0244111 A1 | 8/2015 | Ju |
| 2015/0340782 A1 | 11/2015 | Amini et al. |

FOREIGN PATENT DOCUMENTS

| | | |
|---|---|---|
| CN | 102341970 | 2/2012 |
| CN | 103140995 | 6/2013 |
| EP | 1 085 604 | 3/2001 |
| EP | 2 228 871 | 9/2010 |
| EP | 2 590 273 | 5/2013 |
| GB | 2 067 361 | 7/1981 |
| WO | 2011/163256 | 12/2011 |
| WO | 2012/177905 | 12/2012 |

OTHER PUBLICATIONS

Office Action dated Aug. 10, 2017 in U.S. Appl. No. 15/368,691, 11 pages.
Notice of Allowance dated Aug. 16, 2017 in U.S. Appl. No. 15/268,645, 10 pages.
International Search Report and Written Opinion of the International Seaching Authority dated Mar. 17, 2015 for PCT Patent Application No. PCT/US2015/010253, 12 pages.
Invitation to Pay Additional Fees and, Where Applicable, Protest Fee with Partial International Search Report dated Apr. 28, 2015 for PCT Patent Application No. PCT/US2014/065968, 6 pages.
Invitation to Pay Additional Fees and, Where Applicable, Protest Fee with Partial International Search Report dated May 4, 2015 for PCT Patent Application No. PCT/US2014/065996, 7 pages.
International Search Report and Written Opinion of the International Seaching Authority dated Jul. 3, 2015 for PCT Patent Application No. PCT/US2014/065968, 17 pages.
International Search Report and Written Opinion of the International Seaching Authority dated Jul. 10, 2015 for PCT Patent Application No. PCT/US2014/065996, 18 pages.
Notice of Allowance dated Oct. 14, 2015 for U.S. Appl. No. 14/543,768, 9 pages.
Office Action dated Nov. 10, 2015 for U.S. Appl. No. 14/543,717, 16 pages.
Final Office Action dated Mar. 28, 2016 for U.S. Appl. No. 14/543,711, 9 pages.
Office Action dated Dec. 9, 2015 for U.S. Appl. No. 14/543,711, 15 pages.
Office Action dated Jan. 4, 2016 for U.S. Appl. No. 14/543,803, 14 pages.
Taiwan Office Action dated Nov. 23, 2015 for Taiwan Application No. 103139835, 7 pages.
Restriction Requirement dated Feb. 16, 2016, for U.S. Appl. No. 14/641,375, 5 pages.
Notice of Allowance, U.S. Appl. No. 14/543,717, dated May 25, 2016, 8 pages.
Notice of Allowance, U.S. Appl. No. 14/543,803, dated Jun. 27, 2016, 7 pages.
Notice of Allowance, U.S. Appl. No. 14/641,353, dated Jan. 25, 2016, 8 pages.
First Action Interview Pilot Program Pre-Interview Communication, U.S. Appl. No. 14/641,375, dated May 16, 2016, 7 pages.
Office Action, Chinese Patent Application No. 201410858208.7, dated Jul. 4, 2016, 19 pages.
International Preliminary Report on Patentability, International Patent Application No. PCT/US2014/065968, dated May 26, 2016, 12 pages.
International Preliminary Report on Patentability, International Patent Application No. PCT/US2014/065996, dated May 26, 2016, 14 pages.
Office Action (English Translation) dated Apr. 17, 2017 in Chinese Patent Application No. 201410858208.7, 7 pages.
Office Action (English Translation) dated May 18, 2017 in Korean Patent Application No. 10-2016-7012914, 5 pages.
Office Action (English Translation) dated May 31, 2017 in Chinese Patent Application No. 201510013108.9, 10 pages.
Notice of Allowance dated Jun. 19, 2017 in U.S. Appl. No. 15/168,036, 8 pages.
Universal Serial Bus Type-C Cable and Connector Specification (Revision from Apr. 3, 2015), USB 3.0 Promoter Group, Mar. 25, 2016, 248 pages.

(56) References Cited

OTHER PUBLICATIONS

Universal Serial Bus Type-C Cable and Connector Specification (Revision 1.0), USB 3.0 Promoter Group, Aug. 11, 2014, 171 pages.
Universal Serial Bus Type-C Cable and Connector Specification (Revision 1.2), USB 3.0 Promoter Group, Mar. 25, 2016, 221 pages.
Office Action (English Translation) dated Dec. 28, 2017 in Korean Patent Application No. 10-2016-7012914, 10 pages.
Office Action dated Mar. 5, 2018 in U.S. Appl. No. 15/396,640, 13 pages.

\* cited by examiner

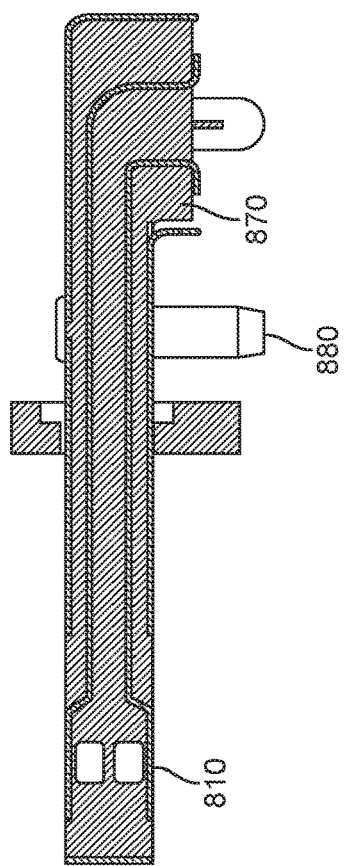
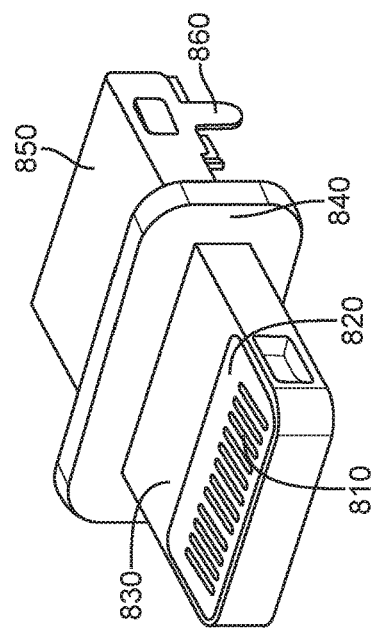
FIG. 8

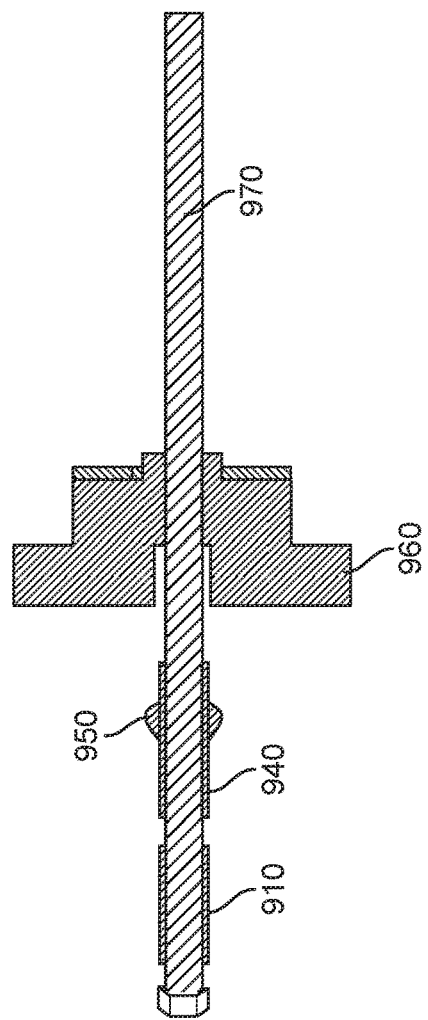
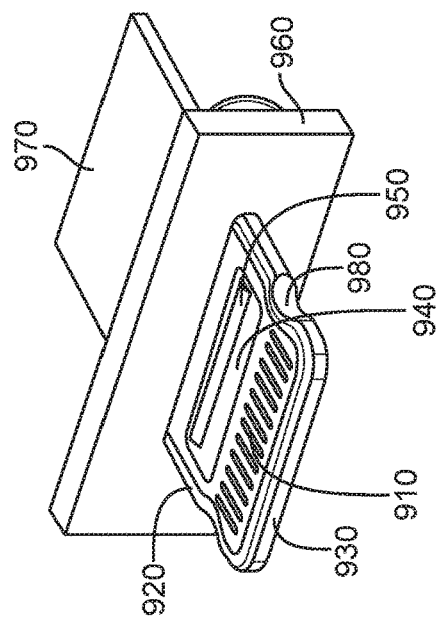
FIG. 9

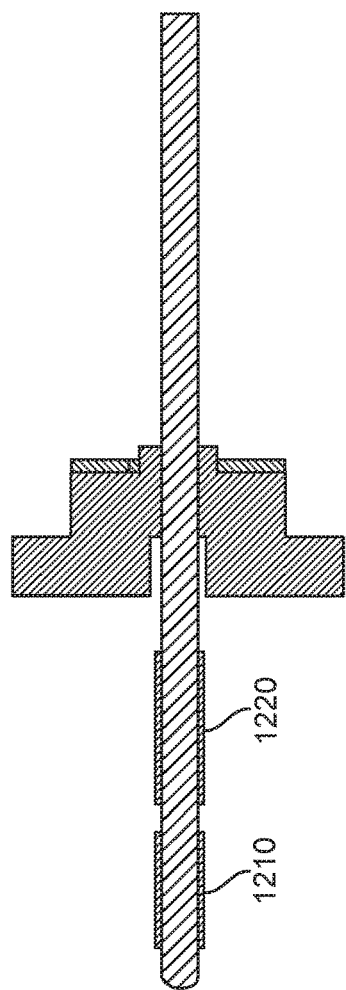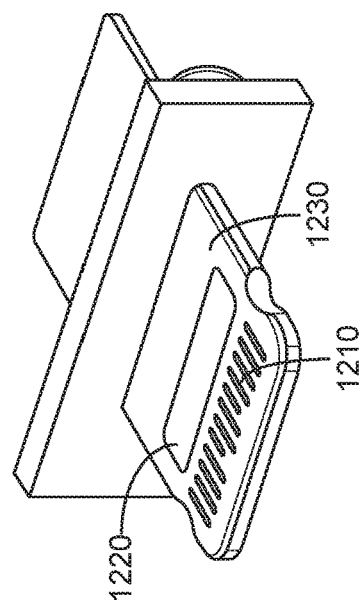
FIG. 12

| CONNECTOR PINOUT | | | | | | | | | |
|---|---|---|---|---|---|---|---|---|---|
| P | TX0 | G | LSI | AP | LSTX | P | RX0 | RX0 | G |
| P | RX1 | G | LSRX | CP | LSI | P | TX1 | TX1 | G |

FIG. 35

CONNECTOR PINOUT

| 12T | | | | | | | | | | | | 1T |
|---|---|---|---|---|---|---|---|---|---|---|---|---|
| G | HS1P | HS1N | HVP1 | C1 | USB1 | USB0 | RFU0 | HVP0 | HS0N | HS0P | G | |
| G | HS2P | HS2N | HVP2 | RFU1 | USB2 | USN3 | C2 | HVP3 | HS3N | HS3P | G | |
| 1B | | | | | | | | | | | | 12B |

FIG. 36

CONNECTOR RECEPTACLE HAVING A TONGUE

CROSS-REFERENCES TO RELATED APPLICATIONS

This application is a continuation of U.S. patent application Ser. No. 14/543,748, filed Nov. 17, 2014, which claims the benefit of U.S. provisional patent applications No. 61/905,278, filed Nov. 17, 2013, 61/918,608, filed Dec. 19, 2013, 61/922,849, filed Jan. 1, 2014, and 62/003,022, filed May 26, 2014, which are incorporated by reference.

BACKGROUND

The amount of data transferred between electronic devices has grown tremendously the last several years. Large amounts of audio, streaming video, text, and other types of data content are now regularly transferred among desktop and portable computers, media devices, handheld media devices, displays, storage devices, and other types of electronic devices. Power may be transferred with this data, or power may be transferred separately.

Power and data may be conveyed over cables that may include wire conductors, fiber optic cables, or some combination of these or other conductors. Cable assemblies may include a connector insert at each end of a cable, though other cable assemblies may be connected or tethered to an electronic device in a dedicated manner. The connector inserts may be inserted into receptacles in the communicating electronic devices to provide paths for power and data.

These receptacles may be visible along a side of a device and may consume internal space inside the device. Accordingly, it may be desirable to provide receptacles having a reduced profile and size, as well as pleasant appearance. Also, the data rates through these connector receptacles may be quite high. To provide these high data rates, it may be desirable that the connector receptacles have a high signal integrity and low insertion loss.

These connector inserts may be inserted into a device receptacle once or more each day for multiple years. It may be desirable that these connector inserts and receptacles are reliable and do not break or wear down prematurely, since such failures may lead to user dissatisfaction with both the cable assembly and the electronic devices that they connect to.

Electronic devices may be sold in the millions, with an attendant number of cable assemblies and their connector inserts sold alongside. With such volumes, any reduction or simplification in the manufacturing becomes significant. For such reasons, it may be desirable that these connector inserts and receptacles are readily manufactured.

Thus, what is needed are connector inserts and receptacles that have an attractive appearance, a low profile, a high signal integrity and low insertion loss, are reliable, and are readily manufactured.

SUMMARY

Accordingly, embodiments of the present invention may provide connector inserts, receptacles, and other structures that have an attractive appearance, a low profile, a high signal integrity and low insertion loss, are reliable, and are readily manufactured.

An illustrative embodiment of the present invention may provide attractive electronic devices by providing a connector receptacle having a reduced complexity and a resulting simplified appearance. This reduced complexity may also improve device manufacturability and reliably, and improve durability as well.

An illustrative embodiment of the present invention may provide a connector receptacle having a reduced complexity by providing a connector receptacle having a tongue located in an opening or recess in an enclosure or housing for an electronic device. The opening or recess in the enclosure may be formed as part of the enclosure, where the enclosure itself may form sides of the connector receptacle. That is, the enclosure may form top, bottom, left, and right sides of the enclosure. In various embodiments of the present invention, at least a portion of a back of the connector receptacle may be formed by the housing or enclosure as well. In some embodiments of the present invention, a slot may be formed in the enclosure at a rear of the connector receptacle. A tongue may be inserted through the slot into the opening or recess in the enclosure that forms part of the connector receptacle. Positioned in this way, it may mate with a connector insert when the connector insert is inserted into the connector receptacle. The tongue may be part of a printed circuit board, attached to a printed circuit board, the device enclosure, or other structure associated with or connected to a printed circuit board or device enclosure. In still other embodiments of the present invention, a rear of the connector receptacle may be formed by a bracket, where the bracket at least partially surrounds the tongue. The bracket may be attached to a printed circuit board, to the device enclosure, or other structure associated with or connected to a printed circuit board or device enclosure. In various embodiments of the present invention, the tongue may be inserted through a slot in the bracket, or the bracket may be formed around or otherwise attached to a part of the tongue.

An illustrative embodiment of the present invention may provide devices having a low profile by employing a tongue formed of a printed circuit board. Contacts may be printed, plated, or otherwise formed on a surface of the printed circuit board. This may provide a thin tongue, thereby helping to reduce the profile of the connector. Also, this configuration may remove the need for conventional spring-type signal contacts that may increase a profile or height of a receptacle. The removal of these spring-type signal contacts may also improve the reliability and durability of these connectors. Specifically, connector inserts or other items won't be caught on these contacts, thereby damaging the receptacle and device. Instead, embodiments of the present invention may include these spring-type signal contacts in the connector insert or plug. This way, if a spring-type signal contact is damaged, only a cable may need to be replaced and the device itself may not be damaged.

In various embodiments of the present invention, a tongue formed of a printed circuit board may be formed as part of a motherboard, main logic board, or other printed circuit board or appropriate substrate. Contacts on the tongue may electrically connect to circuits, contacts, components, and other electronic components on the printed circuit board using traces, planes, jumpers, cables, and other electrical paths in or associated with the printed circuit board. In various embodiments, a tongue may be formed on an edge of a printed circuit board. The tongue may be inserted in a slot in a back of a receptacle opening formed in a device enclosure in order to form a connector receptacle to mate with a connector insert.

An illustrative embodiment of the present invention may provide connector receptacles having good retention properties. For example, a connector receptacle tongue may include notches on each of a left and right side, where the notches accept side ground contacts on a connector insert when the connector insert is inserted into the connector receptacle. In some embodiments of the present invention, the tongue may be very thin, and may show wear along the notches after repeated use. Accordingly, these embodiments may include other retention elements, such as speed bumps, one either or both a top and bottom side. These speed bumps may help to distribute the retention load among multiple structures thereby preventing excessive localized wear. These speed bumps may be connected to ground and may provide a portion of a ground shielding as well as a retention force. The speed bump may be shaped to provide a pleasant tactile feel to a user. For example, the insertion profile may be made to be smooth, while requiring a strong extraction force. Use of these speed bumps may also help to reduce wear on the tongue of the receptacle, thereby improving durability and reliability.

Another illustrative embodiment of the present invention may provide connector inserts to mate with these connector receptacles. One specific embodiment may provide a connector insert having a tip formed of plastic or other non-marring material at a front end. This plastic tip may help to reduce wear during repeated insertions. The connector insert may include a grounded metallic shield behind the tip for isolation purposes. One or more spring contacts may be attached to an inside portion of the shield to engage the speed bumps or other retention features on the receptacle tongue. This may provide retention and it may provide a ground path from the shield, through the spring contacts, to the tongue of the connector receptacle. In other embodiments of the present invention, other structures, such as dimples, may be used to form this ground path and to provide retention.

In other embodiments of the present invention, ground or electromagnetic interference (EMI) features may be located elsewhere. For example, in various embodiments of the present invention, side contacts may be arranged on each of two sides of a receptacle tongue. The tongue may have a wide front portion to support a number of contacts. The tongue may then have a narrower portion behind the front, wider portion, where the side ground contacts are located. In this way, side ground contacts may be added to a connector receptacle without negatively degrading appearance.

Embodiments of the present invention may provide connector inserts or plugs to mate with these receptacles. These inserts may include a shield around a number of contacts. The shield may have one or more cutouts or openings to accept contacting portion of the side ground contacts in the receptacle. That is, when the connector insert is inserted into the receptacle, the side ground contacts may slide along an inside of the insert shield until contacting portions engage openings the insert shield. This may help maintain an attractive appearance for both the connector receptacle and insert.

These arrangements may provide a plug and receptacle combination that is self-shielded, that is, the combination does not rely on other features, such as features located in the device enclosure, for shielding. In one example, an outside of the plug may be shielded. Spring contacts may be attached to an inside of the shield. These spring contacts may form an electrical connection with speed bumps and ground pads on a tongue of the connector receptacle. This may form a Faraday cage around contacts on the tongue. In another, side ground contacts on a receptacle tongue may slide along an inside surface of an insert shield during insertion, where contacting portions of the side ground contacts fit in opening in the insert shield. These configurations may form a Faraday cage around contacts on the tongue.

Again, in various embodiments of the present invention these shielding arrangements may be further improved. For example, a ground plane may be placed at or near a center of the receptacle tongue. This ground plane may help to isolate signal paths on a top side of the tongue from a bottom side of the tongue. The plug may have a similar ground plane located between a top row of signal contacts and a bottom row of signal contacts. Again, this plug ground plane may help to isolate signals in the top row of signal contacts from the bottom row of signal contacts. This ground plane may be located in a housing and may be between receive and transmit signal contacts. The ground plane may be absent under one or more contacts in order to provide wider housing areas for mechanical support and to prevent the thinning of the housing that may otherwise result.

In various embodiments of the present invention, spring contacts for ground in a connector insert may engage signal (non-ground) or power contacts on the receptacle tongue during insertion. To avoid shorting power contacts to ground, the spring contacts may be spaced such that they do not encounter the power contacts, or make other undesirable connections to other contacts, during insertion.

As described above, a tongue may be mated to a device enclosure housing these connector receptacles in different ways in different embodiments of the present invention. Again, an opening or recess in a device housing or enclosure may form a receptacle opening, and a rear or back of the receptacle opening may have a slot or opening or passage. The tongue of the receptacle may be slid through the slot and into the connector receptacle opening. Where one or more speed bumps are used, the slot may be wide enough to accept the speed bumps, or the speed bumps may be attached after the tongue is fit through the slot. In other embodiments of the present invention, a back of the connector receptacle may be open or absent. In this case, a bracket piece may be formed around, soldered to, or otherwise connected to the tongue. This piece may then form the back of the connector receptacle. In still other embodiments of the present invention, the tongue of the receptacle may be formed as part of a printed circuit board for an electronic device. The tongue may be fit through a slot in the back of an opening in an enclosure for the device, thereby forming the connector receptacle.

An illustrative embodiment of the present invention may provide connector receptacles having a high signal quality by simplifying their physical signal path. In one embodiment, the connector receptacle may be formed primarily of a printed circuit board. Contacts on the connector receptacles may be akin to conventional contacts on a printed circuit board. These contacts may have reduced size to decrease contact-to-contact and other stray capacitance. This reduced size may also help limit reflections that may otherwise occur from stub-effects within the contact. Resistance may also be reduced. These reductions in capacitance, stub-effects, and resistance may help improve signal quality, reduce insertion loss, and help improve impedance matching.

Embodiments of the present invention may route traces through the printed circuit board to these contacts. These traces may be matched impedance lines. For example, strip line impedance techniques may be employed in routing signals away from the contacts through the printed circuit board.

Again, embodiments of the present invention may provide connector inserts having a plastic tip at a front opening. In other embodiments of the present invention, the front opening may be defined by a metal portion. This metal portion may be separate from a connector insert shield, or it may be formed as part of the connector insert shield. The metal portion may be optionally coated with a material to avoid marring after repeated insertions into a connector receptacle. Forming the tip from metal may increase the strength of the connector insert, making it less likely to be damaged after repeated insertions into a corresponding connector receptacle.

In various embodiments of the present invention, it may be desirable to provide a strong retention force between a connector insert and a connector receptacle when a connector insert is inserted into the connector receptacle. In various embodiments of the present invention, it may be desirable to provide this strong retention force without actually providing a locking feature. Accordingly, embodiments of the present invention may provide side ground retention springs that may provide a strong retention force without providing or relying on a locking feature. These retention springs may be tapered in one or more axes along its length in order to increase its effective size without consuming excessive space inside a connector. In one embodiment of the present invention, these retention springs may be located in a connector insert, though in other embodiments of the present invention, they may be located in a connector receptacle.

Various embodiments of the present invention may provide connector receptacles where the tongue is formed using a printed circuit board technology. In some of these embodiments of the present invention, the tongue may be a portion of a larger printed circuit board, such as a main logic or motherboard of an electronic device, a daughter board that is attached to such a motherboard, or other type of board.

In various embodiments of the present invention, contacts and other conductive portions of connector inserts and receptacles may be formed by stamping, metal-injection molding, machining, micro-machining, 3-D printing, or other manufacturing process. The conductive portions may be formed of stainless steel, steel, copper, copper titanium, phosphor bronze, or other material or combination of materials. They may be plated or coated with nickel, gold, or other material. The nonconductive portions may be formed using injection or other molding, 3-D printing, machining, or other manufacturing process. The nonconductive portions may be formed of silicon or silicone, rubber, hard rubber, plastic, nylon, liquid-crystal polymers (LCPs), or other nonconductive material or combination of materials. The printed circuit boards used may be formed of FR-4, BT or other material. Printed circuit boards may be replaced by other substrates, such as flexible circuit boards, in many embodiments of the present invention.

Embodiments of the present invention may provide connector inserts and receptacles that may be located in, and may connect to, various types of devices, such as portable computing devices, tablet computers, desktop computers, laptops, all-in-one computers, wearable computing devices, cell phones, smart phones, media phones, storage devices, portable media players, navigation systems, monitors, power supplies, adapters, remote control devices, chargers, and other devices. These connector inserts and receptacles may provide pathways for signals that are compliant with various standards such as one of the Universal Serial Bus (USB) standards including USB-C, High-Definition Multimedia Interface® (HDMI), Digital Visual Interface (DVI), Ethernet, DisplayPort, Thunderbolt™, Lightning™, Joint Test Action Group (JTAG), test-access-port (TAP), Directed Automated Random Testing (DART), universal asynchronous receiver/transmitters (UARTs), clock signals, power signals, and other types of standard, non-standard, and proprietary interfaces and combinations thereof that have been developed, are being developed, or will be developed in the future. Other embodiments of the present invention may provide connector inserts and receptacles that may be used to provide a reduced set of functions for one or more of these standards. In various embodiments of the present invention, these interconnect paths provided by these connector inserts and receptacles may be used to convey power, ground, signals, test points, and other voltage, current, data, or other information.

Various embodiments of the present invention may incorporate one or more of these and the other features described herein. A better understanding of the nature and advantages of the present invention may be gained by reference to the following detailed description and the accompanying drawings.

BRIEF DESCRIPTION OF THE DRAWINGS

FIG. 8 illustrates a tongue for a connector receptacle according to embodiment of the present invention;

FIG. 9 illustrates a tongue for a connector receptacle according to embodiment of the present invention;

FIG. 12 illustrates another tongue for connector receptacle according to an embodiment of the present invention;

FIG. 35 illustrates a pinout for a connector receptacle according to an embodiment of the present invention;

FIG. 36 illustrates another pinout for a connector receptacle according to an embodiment of the present invention.

DESCRIPTION OF ILLUSTRATIVE EMBODIMENTS

Figure 1:
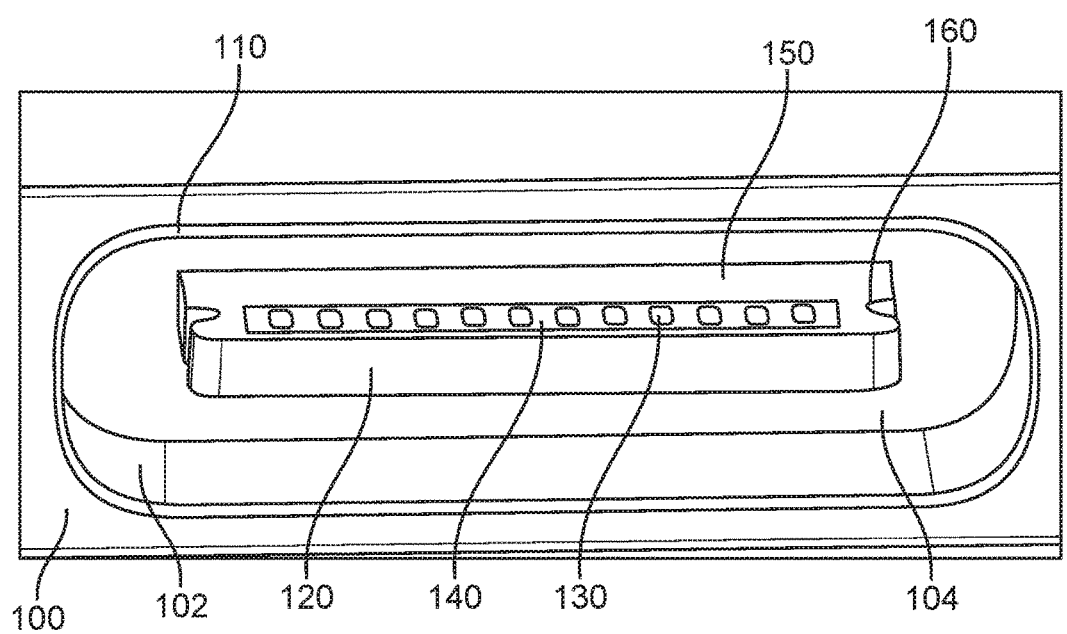
FIG. 1 illustrates a connector receptacle according to an embodiment of the present invention.

FIG. 1 illustrates a connector receptacle according to an embodiment of the present invention. This figure, as with the other included figures, is shown for illustrative purposes and does not limit either the possible embodiments of the present invention or the claims. Also, while only one surface of the tongue is shown in this in the other included figures, a second, opposite surface of the tongue may be identical or similar to the illustrated top surface and may include identical or similar features and structures.

This connector receptacle may be formed in opening 110 in enclosure 100. Enclosure 100 may include sidewall 102. That is, sidewall 102 may be around a top, bottom, left, and right sides of the receptacle and may be formed as part of enclosure 100. In this and similar embodiments of the present invention, sidewalls, such as sidewall 102, may be formed as a unitary part of enclosure 100, sidewall 102 may be formed separately then attached to enclosure 100, sidewall may be molded, printed, or otherwise formed on enclosure 100, or other manufacturing techniques may be used. Enclosure 100 may be a housing for an electronic device such as a portable computing device, tablet, desktop computer, laptop, all-in-one computer, cell phone, smart phone, media phone, storage device, portable media player, wearable computing device, navigation system, monitor, power supply, adapter, and charger, or other device.

This receptacle may further include a rear wall 104. In this and other similar embodiments of the present invention, rear walls, such as rear wall 104, may be formed with or as part of sidewall 102 of device enclosure 100. In these embodiments of the present invention, rear wall 104 may include a slot into which tongue 120 may be inserted. Tongue 120 may be formed as part of a printed circuit board, or tongue 120 may be attached to enclosure 100, a printed circuit board, or other structure. In other embodiments of the present invention, rear wall 104 may be formed separately. For example, rear wall 104 may be insert molded around tongue 120, or tongue 120 may be inserted through a slot in rear wall 104. Tongue 120 may be formed as part of a printed circuit board for an electronic device. The tongue may be inserted through a slot in read wall 104, or rear wall 104 may be formed around the tongue portion of the printed circuit board. When rear wall 104 is formed separately, for example as a bracket, it may be attached to enclosure 100, a printed circuit board, or other portion of the electronic device. In other embodiments of the present invention, rear wall 104 may be attached in this way using a bracket or other structure.

Connector receptacle may further include tongue 120. Tongue 120 may include a number of contacts 130 surrounded by insulation area 140. A ground ring 150 may be formed around ground isolation area 140. Notches 160 may act as retention features by accepting ground contacts in a connector insert or plug.

This arrangement may provide a greatly simplified connector receptacle. This simplified receptacle may provide a streamlined, attractive appearance to a user. Also, this connector receptacle may be free of spring-type signal contacts on tongue 120, and may also be free of other contacts or alignment features around opening 110 in enclosure 100, though such features may be added consistent with embodiments of the present invention. This streamlining also may also the reliability of this connector. For example, there are no spring-type signal contacts in the receptacle to be damaged by improper insertion of a plug or by the presence of debris or other manner. Instead, embodiments of the present invention move these spring-type signal contacts to the plug side. In this way, if spring contacts are damaged in one of these or other ways, only a cable may need to be replaced since the electronic device itself is not damaged. This simplified connector may also provide a connector system having a plug that may be rotatable and may be inserted in at least two different orientations into the connector receptacle.

Figure 2:
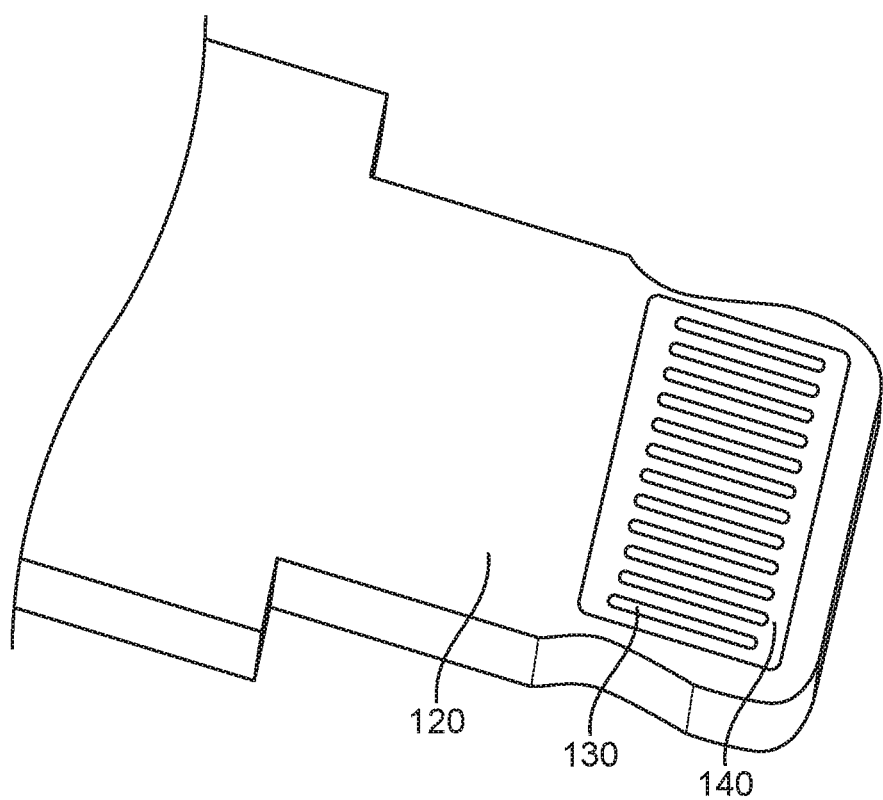
FIG. 2 illustrates a tongue for a connector receptacle according to embodiments of the present invention.

FIG. 2 illustrates a tongue for a connector receptacle according to embodiments of the present invention. This contact may include a ground area on tongue 120 surrounding an isolation area 140. One or more contacts 130 may be located in the isolation area 140.

Again, embodiments of the present invention may provide tongues, such as this tongue, that may be formed as part of a printed circuit board for an electronic device. Various embodiments of the present invention may provide connector receptacles having other types of tongues. An example is shown in the following figure.

Figure 3:
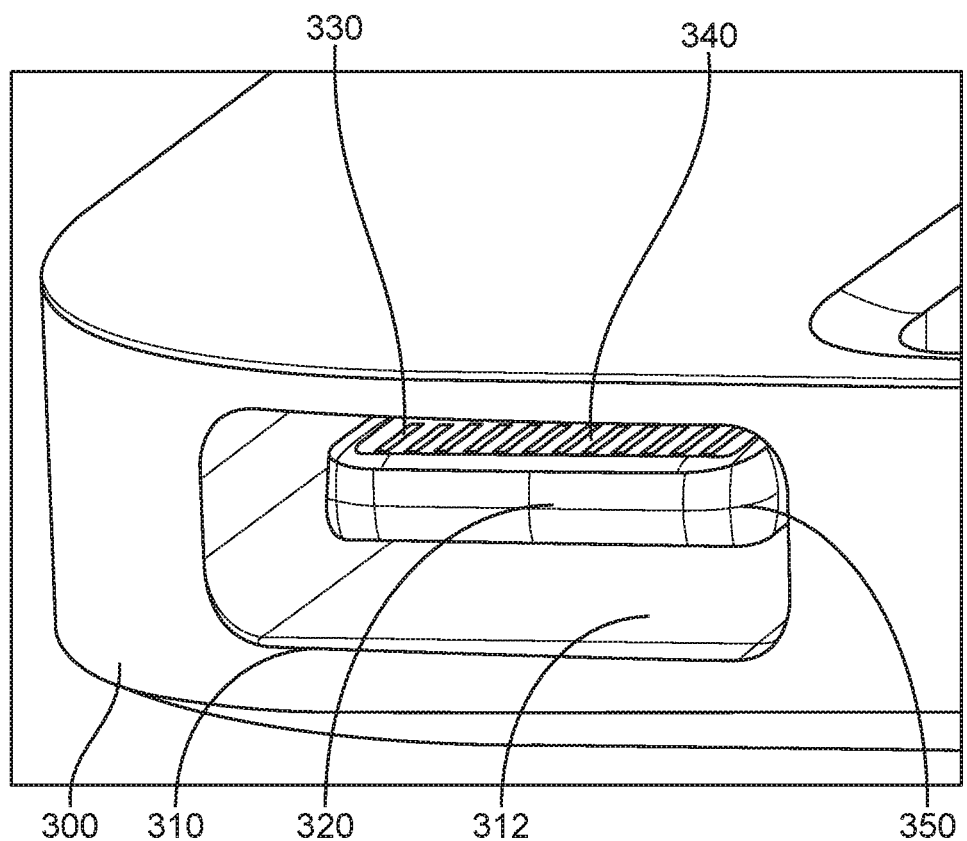
FIG. 3 illustrates a connector receptacle according to an embodiment of the present invention.

FIG. 3 illustrates a connector receptacle according to an embodiment of the present invention. An electronic device may be housed in an enclosure 300. Enclosure 300 may have an opening 310 defined by receptacle sidewall 312. Tongue 320 may include a number of contacts 330 and isolation region 340. Ground ring 350 may be formed along sides of tongue 320.

Figure 4:
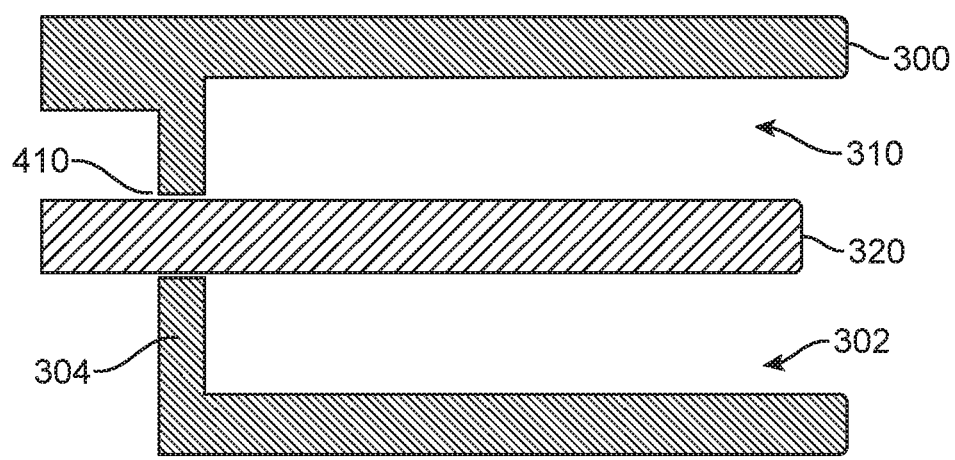
FIG. 4 illustrates a simplified side view of a connector receptacle according to an embodiment of the present invention.

FIG. 4 illustrates a simplified side view of a connector receptacle according to an embodiment of the present invention. Again, enclosure 300 may include opening 310, defined by inner sidewall 302 and rear sidewall 304. Tongue 320 may be inserted through opening 410 in rear wall 304. In other embodiments of the present invention, rear wall 304 may be separate from enclosure 300. In this case, rear wall 304 may be formed, such as by insert molding, around tongue 320 or otherwise attached to tongue 320. Again, sidewalls in embodiments of the present invention, such as sidewall 302, may be formed as part of an enclosure, such as enclosure 300, it may be attached to an enclosure, such as enclosure 300, or it may be formed on an enclosure, such as enclosure 300. Again, these enclosures, such as enclosure 300, may be a housing for an electronic device such as a portable computing device, tablet, desktop computer, laptop, all-in-one computer, cell phone, smart phone, media phone, storage device, portable media player, wearable computing device, navigation system, monitor, power supply, adapter, and charger, or other device.

Embodiments of the present invention may also provide connector inserts or plugs to mate with these connector receptacles. An example is shown in the following figure.

Figure 5:
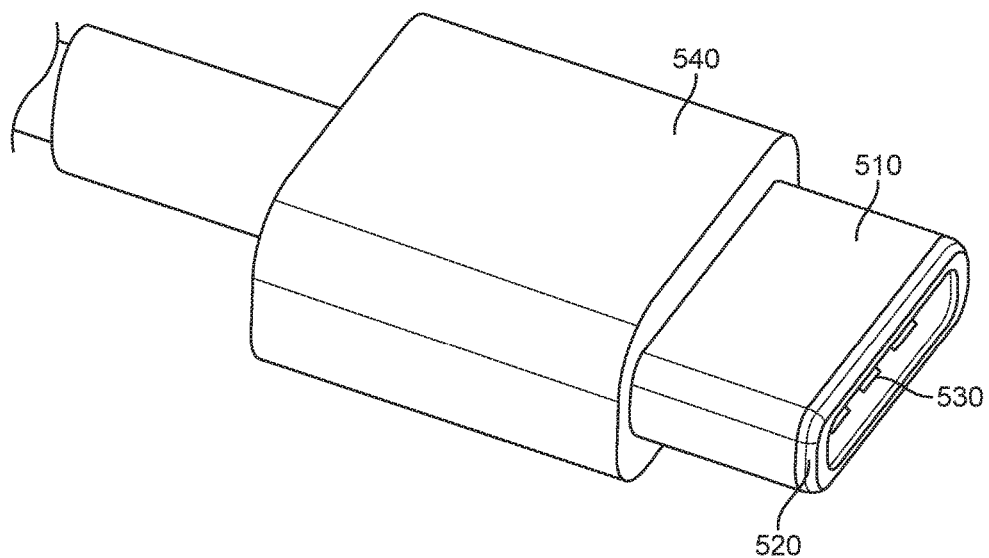
FIG. 5 illustrates a connector insert or plug according to an embodiment of the present invention.

FIG. 5 illustrates a connector insert or plug according to an embodiment of the present invention. This connector insert may include a tip portion 520, which may be located in front of shield portion 510. Tip portion 520 may be formed of plastic or other non-marring material to reduce wear on the connector receptacle and plug. One or more spring contacts 530 may be located in and attached to an inside surface of shield 510. Housing 540 may include various electronic circuits located on one or more printed circuit boards. Housing 540 may also provide a structured to be held by a user during insertion.

While in this example, tip portion 520 may be formed of plastic or other non-marring material, in other embodiments of the present invention, at least some of tip portion 520 may be formed as a one or more magnets or an attraction plate to be magnetically attracted to a one or more magnets or attraction plate in or behind a rear wall of a connector receptacle.

Figure 6:
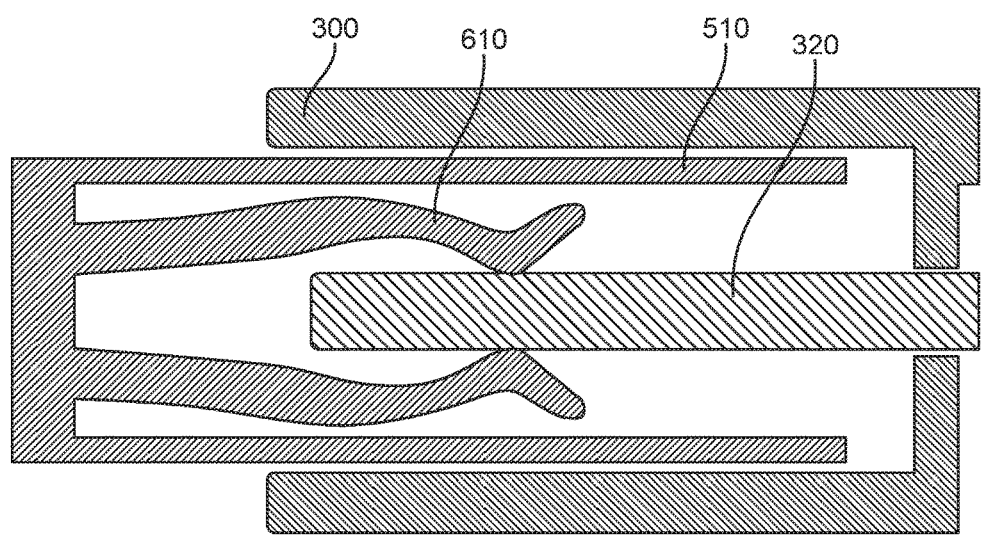
FIG. 6 illustrates a simplified side view of connector system including a connector plug mated to a connector receptacle according to an embodiment of the present invention.

FIG. 6 illustrates a simplified side view of connector system including a connector plug mated to a connector receptacle according to an embodiment of the present invention. A plug may include a shield portion 510 and spring type signal contacts 610. These spring type signal contacts 610 may mate with contacts printed or otherwise formed on tongue 320. Tongue 320 may be located in device enclosure 300.

Various types of tongues may be employed by connector receptacles according to embodiments of the present invention. These tongues may be formed as a printed circuit board. These printed circuit boards may be small and purposed for a connector receptacle, or they may be larger and included as part of a motherboard or other logic board for an electronic device. Examples of various tongues provided by embodiments of the present invention are shown in the following figures.

Figure 7:
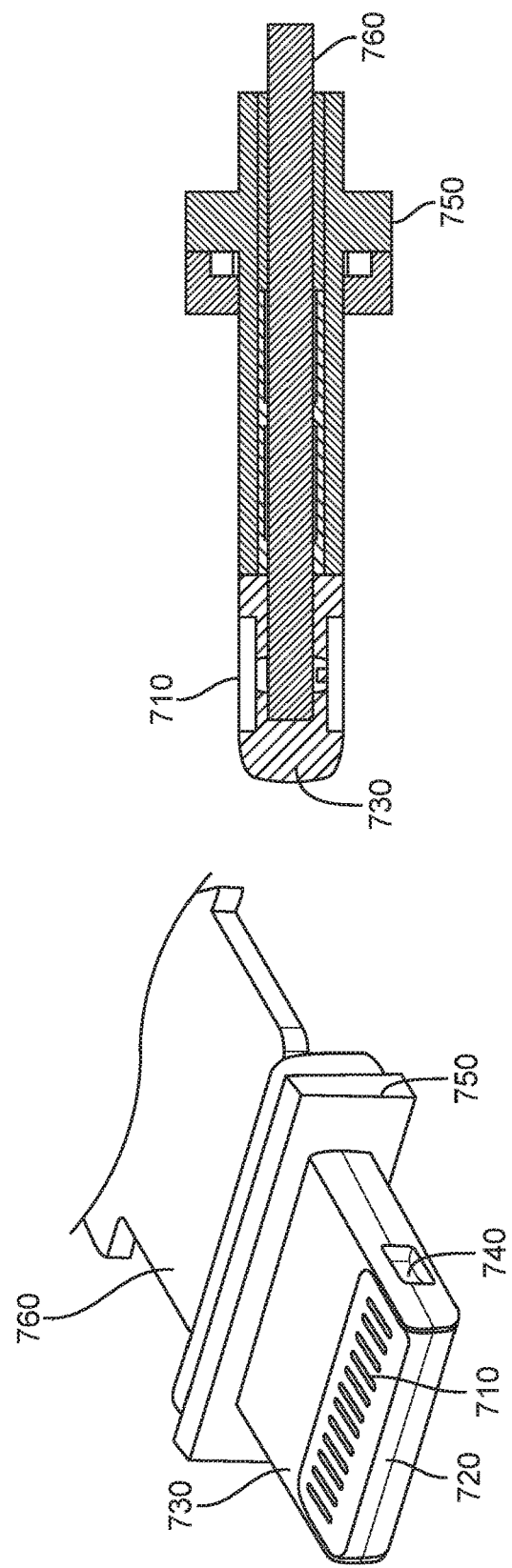
FIG. 7 illustrates a tongue for a connector receptacle according to an embodiment of the present invention.

FIG. 7 illustrates a tongue for a connector receptacle according to an embodiment of the present invention. This and the other tongues shown may be used in connector receptacles according various embodiments of the present invention. This tongue may include a number of contacts 710 and an isolation area 720. Isolation area 720 may be surrounded by ground ring or ground plane 730. Notches 740 may act as retaining features and may mate with ground contacts on a connector insert. Portion 750 may be formed around a tongue and may act as at least part of a rear wall of the connector receptacle. Printed circuit board portion 760 may be part of a larger printed circuit board, such as a motherboard or other printed circuit board in an electronic device. In other embodiments, printed circuit board portion 760 may be a smaller printed circuit board portion and may be joined to other printed circuit boards using wires, flex conductors, or other appropriate structures.

FIG. 8 illustrates another tongue for a connector receptacle according to an embodiment of the present invention. This tongue may include a number of contacts 810 surrounded by isolation area 820. Isolation area 820 may be surrounded by a ground ring or area 830. Again, portion 840 may be part of a rear wall for a connector receptacle. Rear portion 850 may include ground tabs 860, contacts 870, and posts 880 for mounting and signal attachment to a main logic, mother, or other type of printed circuit board.

FIG. 9 illustrates a tongue for a connector receptacle according to embodiment of the present invention. This tongue may include a number of contacts 910 surrounded by isolation area 920. Ground pad 940 may also be surrounded by isolation area 920. One or more retention features, such as speed bump 950, may be included or attached to ground pad 940. Ground ring 930 may be attached around an edge of at least a front portion of the tongue. The edge of the tongue may be chamfered and the ground ring or band 930 may be shaped to mate with it. In other embodiments of the present invention, the edge of the tongue may have a notch or raised portion along a center of the edge. Again, ground ring or band 930 may be shaped to mate with it. Portion 960 may act as a rear wall portion for the connector receptacle. Ground ring or band 930 may be attached to rear portion 960 to be secured in place. Again, printed circuit board portion 970 may be used to form an attachment to a second printed circuit board, or it may be part of a larger printed circuit board such as a main logic or motherboard.

Again, embodiments the present invention may provide tongues for connector receptacles were the tongues are quite thin. These tongues may include side notches, such as notches 980 to act as retention features. Specifically, side notches 980 may engage ground contacts in a connector insert or plug. However, since the tongue is so thin, side notches 980 may wear quickly after repeated insertions.

Accordingly, embodiments of the present invention may provide other retention features, such as speed bumps 950. The inclusion of these speed bumps may allow the retention force to be distributed among multiple structures, instead of placing the retention force on notches 980 and corresponding side ground contacts. These speed bumps may have rising and falling edges to produce a desirable tactile response for a user during insertion and extraction of the plug. For example, speed bump 950 may have a smooth sloped leading-edge to provide a smooth tactile response to a user during insertion. A rear edge of speed bump 950 may be steeper to provide a high retention force in order to help prevent accidental extraction of the plug during use. Spring contacts in the plug may engage the speed bumps 950 to provide the tactile response, retention, and ground paths. An example is shown in the following figure.

Figure 10:
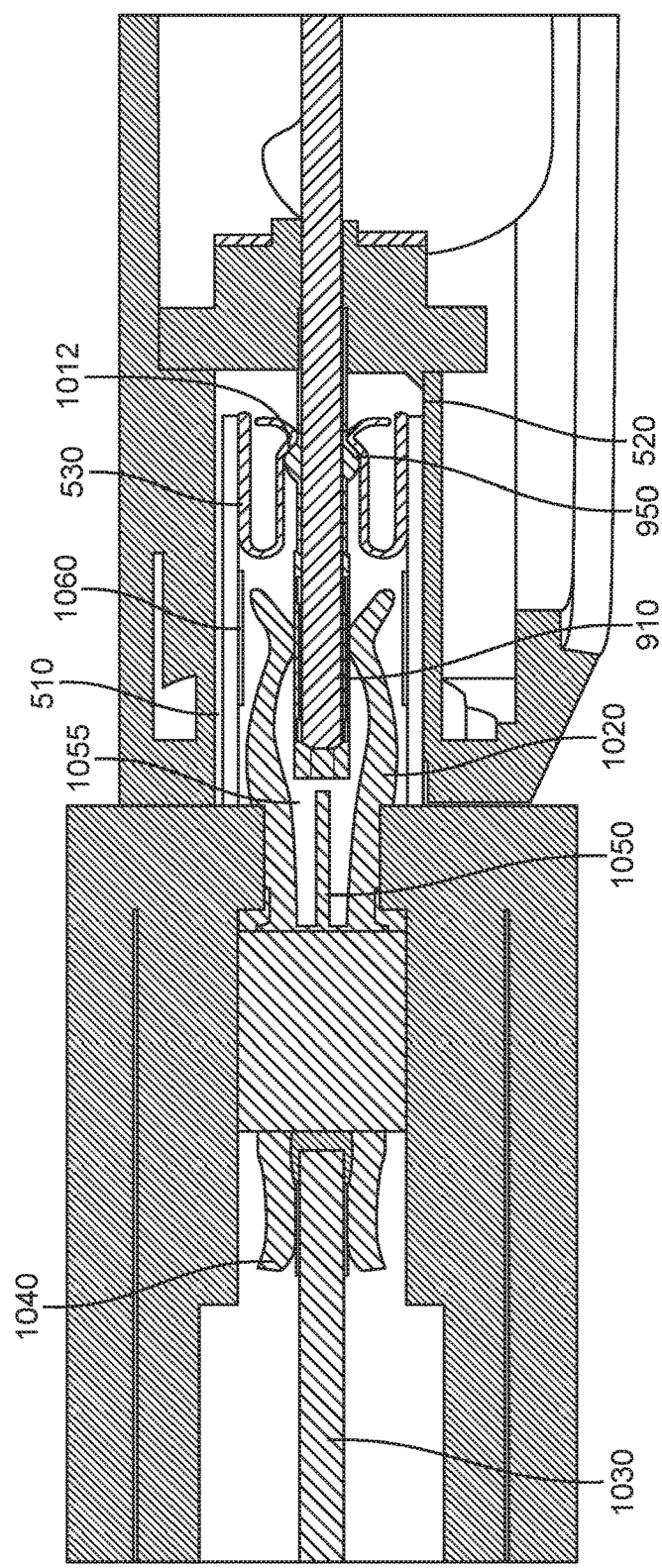
FIG. 10 illustrates a connector system according to an embodiment of the present invention.

FIG. 10 illustrates a connector system according to an embodiment of the present invention. This connector system may include a receptacle having speed bumps 950 on the receptacle tongue. The connector system may further include a plug, which may include shield 510. Spring contacts 530 may be attached to an inside wall of shield 510. Spring contacts 530 may be soldered, or spot or laser welded to the inside of shield 510. In other embodiments of the present invention, spring contacts 530 may be formed in other ways.

The plug may further include spring type signal contacts 1020. Spring type signal contacts 1020 may mate with contacts 910 on a surface of the receptacle tongue. Kapton tape 1060 may be used to isolate signal contacts 1020 from shield 510.

A center ground plane 1050 may isolate signals on a top row of signal contacts 1020 from a bottom row of signal contacts 1020. Center ground plane 1050 may be located between high-speed signal pairs on the top and bottom rows of the contacts. Center ground plane 1050 may be notched in other areas or between these or other signals to increase the thickness and stability of housing portion 1055. A center ground plane may also be located in the receptacle tongue. This ground plane may electrically connect to center ground plane 1050 during insertion or it may be separate from ground plane 1050 during insertion.

Rear portion 1040 of signal contacts 1020 may be electrically connected to traces on printed circuit board 1030. Again, plastic or non-marring material 520 may protect the connector receptacle and connector plug from marring and scratches during insertion.

Figure 11:
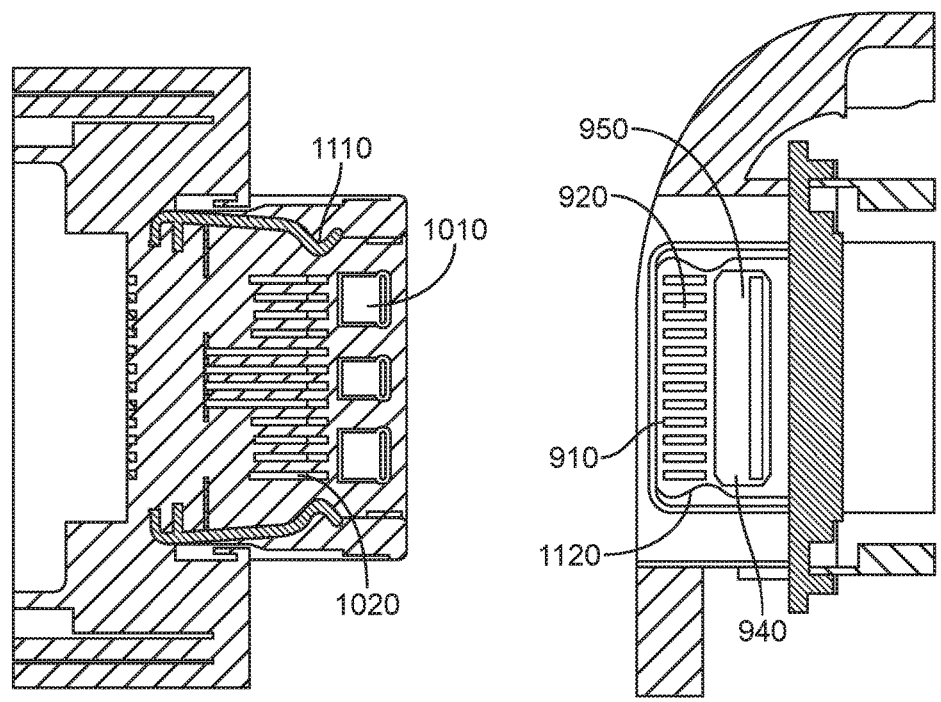
FIG. 11 illustrates a top view of a connector system according to an embodiment of the present invention.

FIG. 11 illustrates a top view of a connector system according to an embodiment of the present invention. In this example, a receptacle may include a number of contacts 910 in an isolation area 920. Ground pad 940 may be surrounded by isolation area 920. Speed bump 950 may be located on ground pad 940. Notches 920 may be included on sides of the tongue.

The connector plug may include a number of spring type signal contacts 1020, side ground contacts 1110, and spring contacts 1010. Signal contacts 1020 may form signal paths with contacts 910. Side ground contacts 1110 may engage notches 1120 to retain the plug in the connector receptacle. Similarly, spring contacts 1020 may mate with speed bump 950 to provide further retention force.

In this way, retention force is provided by side ground contacts 1110 mating with notches 1120, as well as spring contacts 1010 mating with speed bump 950. This distributed retention may prevent excessive wear at any particular location in the connector receptacle, such as notches 1120.

This arrangement also provides shielding for signals on contacts 1020 and 910. Specifically, shield 510 (not shown in this figure) may surround the plug. Side ground contacts 1110 may mate with grounded notches 940, while spring contacts 1010 may form another ground path with speed bumps 950 and ground pads 940.

During insertion, spring contacts 1010 may engage contacts 910 on the receptacle tongue. Since spring contacts 1010 may be grounded, it may be undesirable for a spring contacts 1010 to engage a power pin on the receptacle tongue. Accordingly, spring contacts 1010 (which may be the same as spring contacts 530 and the other spring contacts herein) may be spaced apart or otherwise are arranged to avoid such contact. That is, spring contacts 1010 may be spaced or arranged to not make and undesirable connection to a power contact or form other undesirable connections with other contacts during insertion of the plug into the receptacle.

FIG. 12 illustrates another tongue for connector receptacle according to an embodiment of the present invention. In this example, a number of contacts 1210 may be surrounded by isolation area 1230. Ground pad 1220 may also be surrounded by isolation are 1230.

Ground pad 1220 may be used to make contact with spring contacts or other structures in a connector insert. An example is shown in the following figure.

Figure 13:
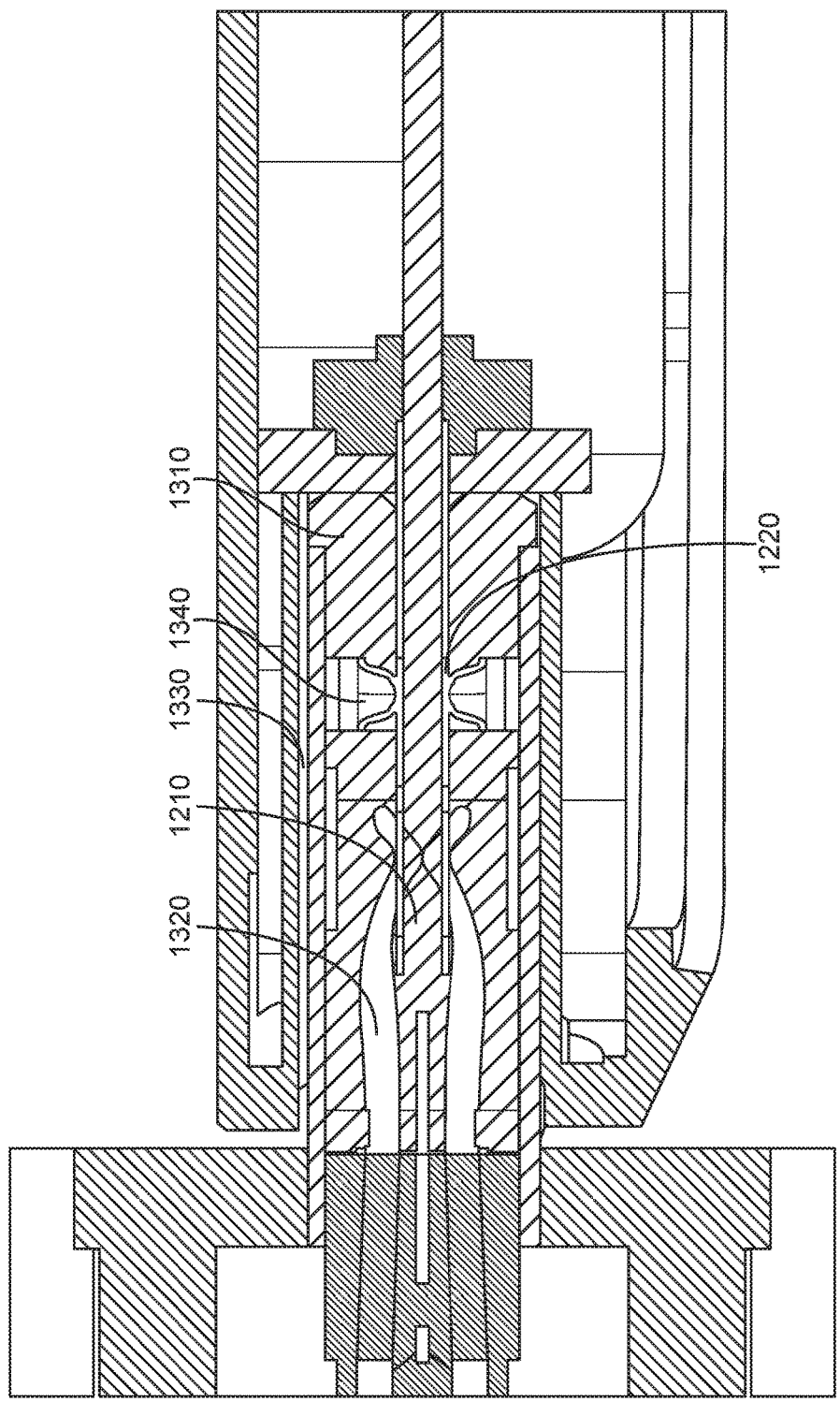
FIG. 13 illustrates a side view of a connector system according to an embodiment of the present invention.

FIG. 13 illustrates a side view of a connector system according to an embodiment of the present invention. In this example, the connector insert or plug may include one or more dimples 1540 for making electrical connections to ground pads 1220 on the receptacle tongue. Dimples 1540 may be attached to or otherwise associated with shield 1530. Spring type signal contacts 1520 may make electrical connections to contacts 1210 on the receptacle tongue.

In other embodiments of the present invention, connector receptacles may include other types of grounding, shielding, and EMI mechanisms and structures. Examples are shown in the following figures.

Figure 14:
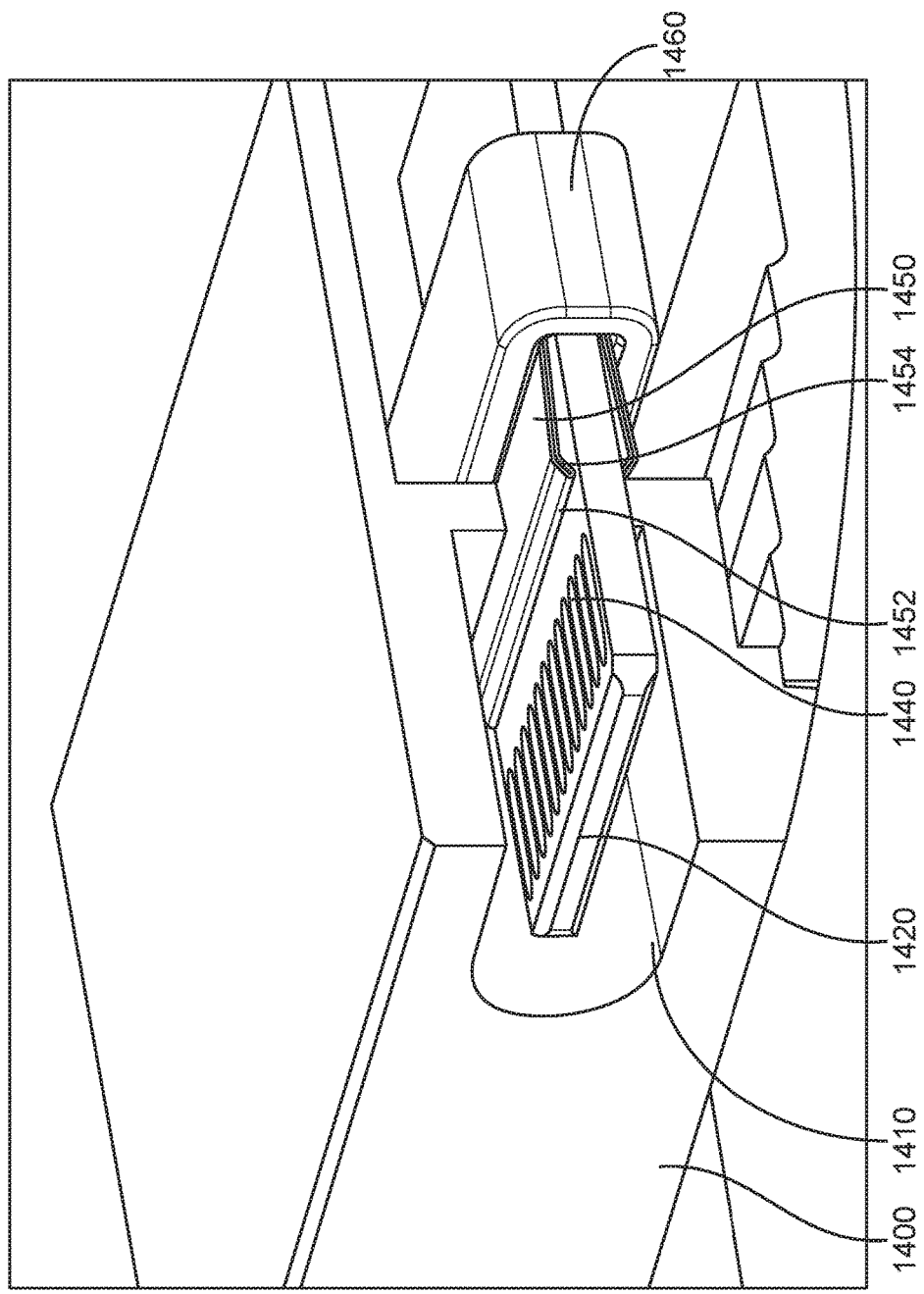
FIG. 14 illustrates a connector receptacle according to an embodiment of the present invention.

FIG. 14 illustrates a connector receptacle according to an embodiment of the present invention. In this example, two ground plates 1450 are held in place by collar 1460. Ground plates 1450 may include leading edge 1452, which may extend from a front of ground plate 1450 to a ridge 1454. This connector receptacle may also include tongue 1420 supporting a number of contacts 1440. This receptacle may be located in an opening 1410 in a device enclosure 1400.

In this as with the other embodiments, tongue 1420 may be inserted through a slot in a back of an opening 1410 in device enclosure 1400. Tongue 1420 may be formed as part of a printed circuit board for the device enclosed by device enclosure 1400.

Figure 15:
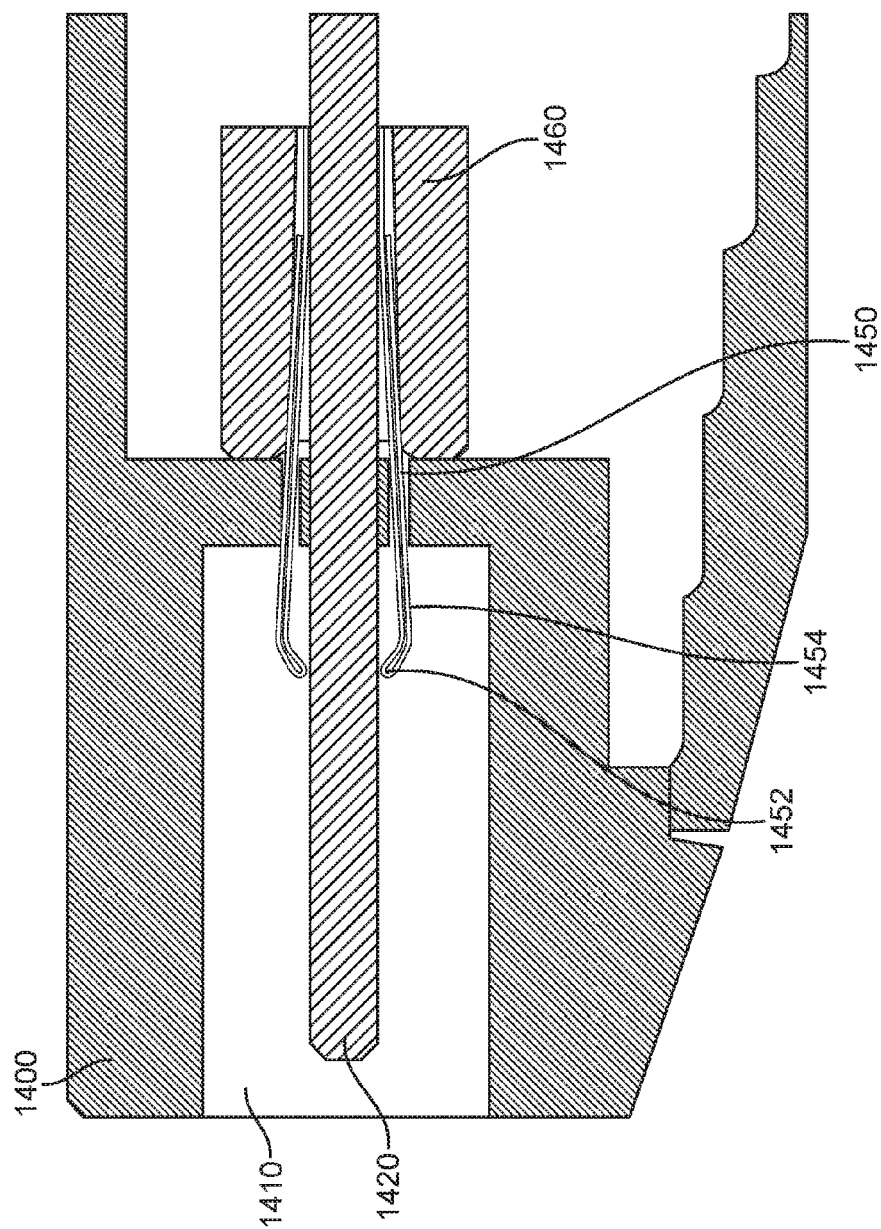
FIG. 15 illustrates a side view of the connector receptacle of FIG. 14.

FIG. 15 illustrates a side view of the connector receptacle of FIG. 14. Again, this receptacle may be located in opening 1410 of device enclosure 1400. The receptacle may include tongue 1420 supporting ground plates 1450. Ground plates 1450 may be held in place by collar 1460. Ground plates 1450 may include leading edges 1452, which may extend from a front of the ground plate 1450 to ridge 1454.

Figure 16:
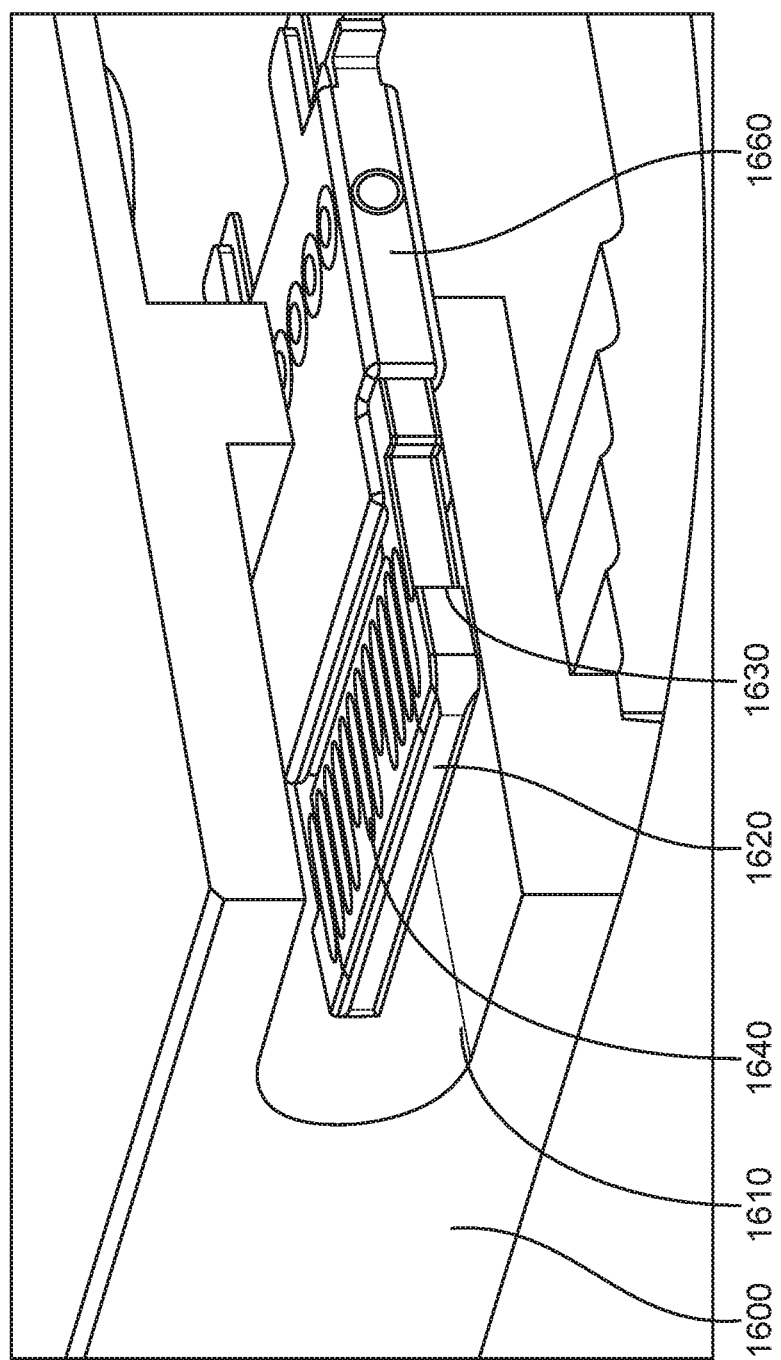
FIG. 16 illustrates another connector receptacle according to an embodiment of the present invention.

FIG. 16 illustrates another connector receptacle according to an embodiment of the present invention. In this example, a ground shield 1660 may be located on connector receptacle tongue 1620. Connector receptacle tongue 1620 may support a number of contacts 1640. Tongue 1620 may also include notches 1630 as before. This connector receptacle may be located in an opening 1610 in a device enclosure 1600.

Figure 17:
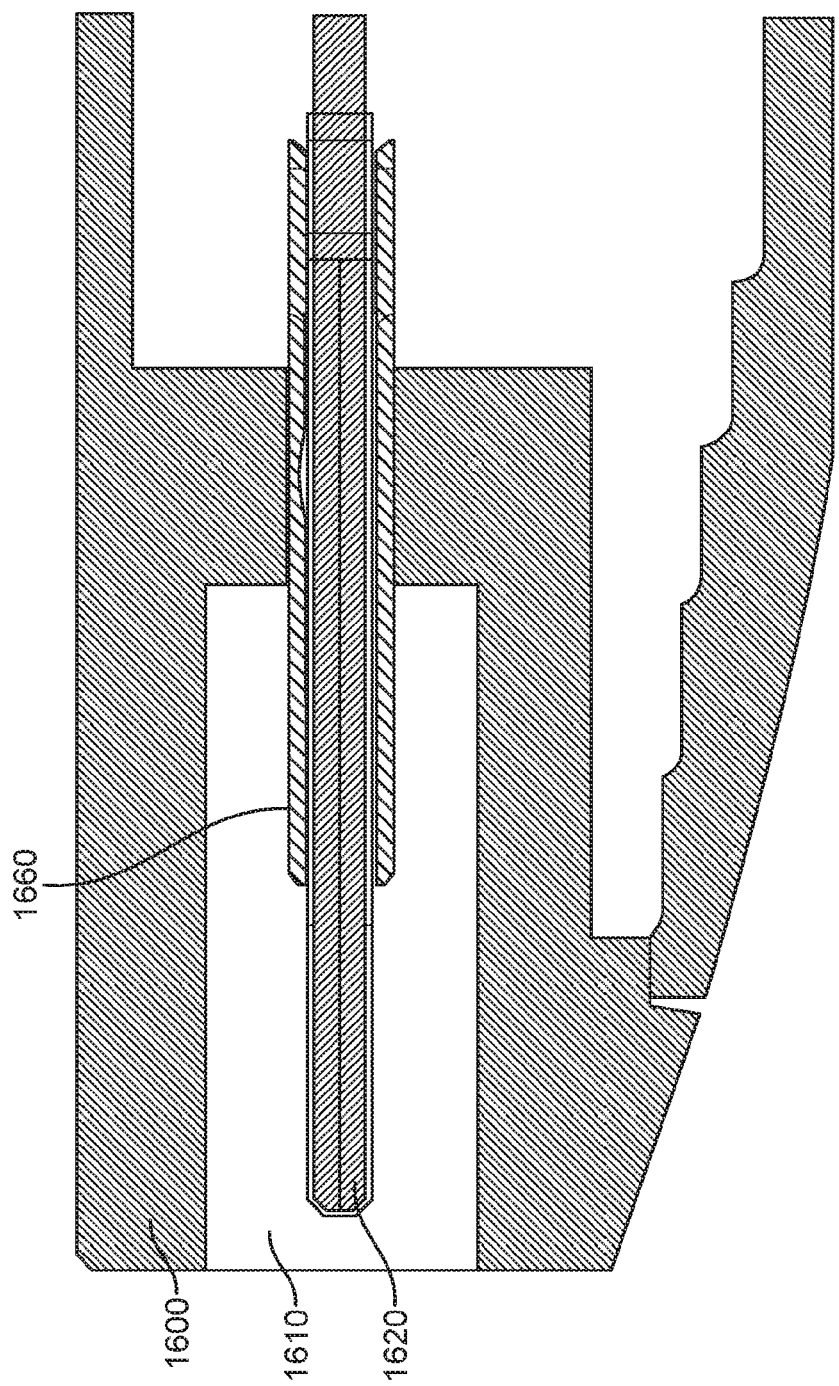
FIG. 17 illustrates a side view of the connector receptacle of FIG. 16.

FIG. 17 illustrates a side view of the connector receptacle of FIG. 16. Again, this connector receptacle may be located in opening 1610 of device enclosure 1600. Connector receptacle may include a tongue 1620 attached to and partially surrounded by a ground shield 1660.

Figure 18:
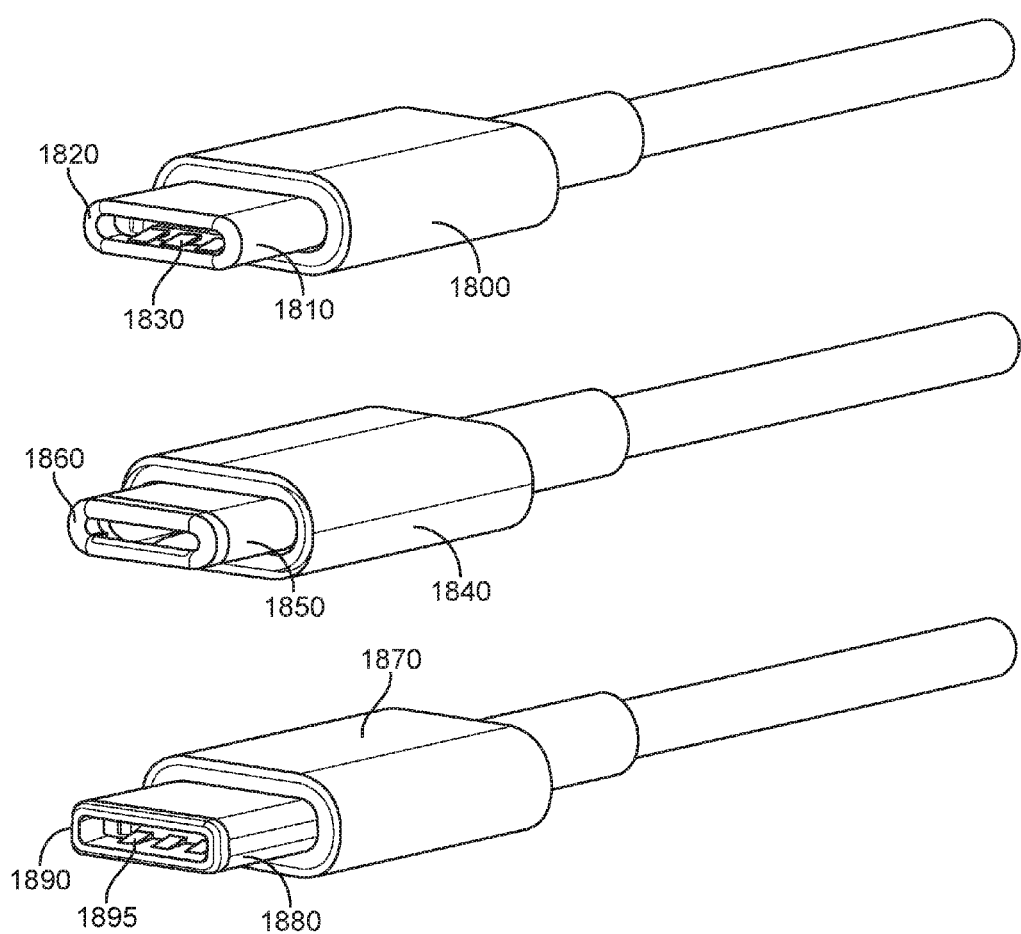
FIG. 18 illustrates additional connector inserts according to embodiments of the present invention.

FIG. 18 illustrates additional connector inserts according to embodiments of the present invention. Connector insert 1800 may include shield 1810 located behind a front housing portion 1820. One or more ground contacts 1830 may be located near an opening of the connector insert 1800. Connector insert 1840 may include shield 1850 behind front housing portion 1860. Similarly, connector insert 1870 may include a shield portion 1880 behind housing portion 1890. One or more ground contacts 1895 may be located near an opening of connector insert.

In these and other embodiments of the present invention, ground and electromagnetic interference shielding and retention features may be provided by other structures. Examples are shown in the following figures.

Figure 19:
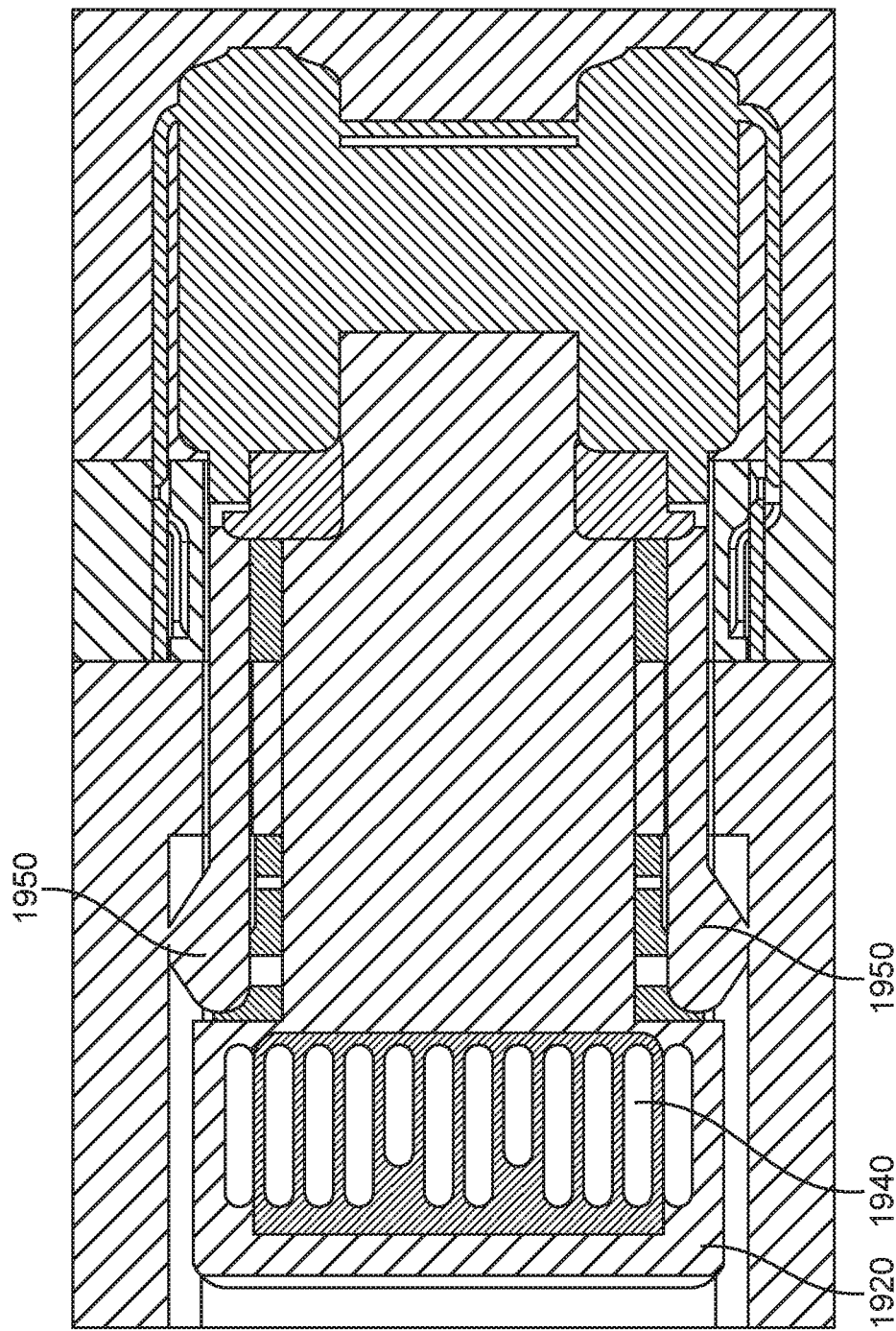
FIG. 19 illustrates a top view of a connector receptacle according to an embodiment of the present invention.

FIG. 19 illustrates a top view of a connector receptacle according to an embodiment of the present invention. This connector receptacle may include tongue 1920 supporting a number of contacts 1940. Again, contacts 1940 may be located on a top or bottom of tongue 1920. Contacts may be located on a relatively wide a front portion 1960, which may be in front of a narrower portion 1970. Side ground contacts 1950 may be located alongside this narrower portion 1970 behind the wider contact portion 1960. In this way, side ground contacts 1950 may be at least somewhat out of view to a user, thereby allowing the connector receptacle to provide an attractive simplified appearance. In embodiments of the present invention where tongue 1920 is a printed circuit board, the routing to and from contacts 1960 may be angled, curved, bent, or otherwise formed to accommodate the different width along the length of the tongue.

When a connector insert is inserted into this connector receptacle, contacting portion 1952 of side ground contacts 1950 may pass along an inside of a shield portion the connector insert. Contacting portion 1952 may then engage or fit in openings in a side of the connector insert shield. In this way, scratches and marring caused by contacting portion 1952 may be limited to an inside of the connector insert shield, thereby preserving the connector insert's appearance.

Side ground contacts 1950 may be formed as part of, or separately from, tongue 1920. Side ground contacts may be formed using a printed circuit board, a metal such as stainless steel, or other material. Side ground contacts 1950 may be attached to tongue 1920 or other receptacle structures by soldering, laser or spot welding, or by other methods.

Figure 20:
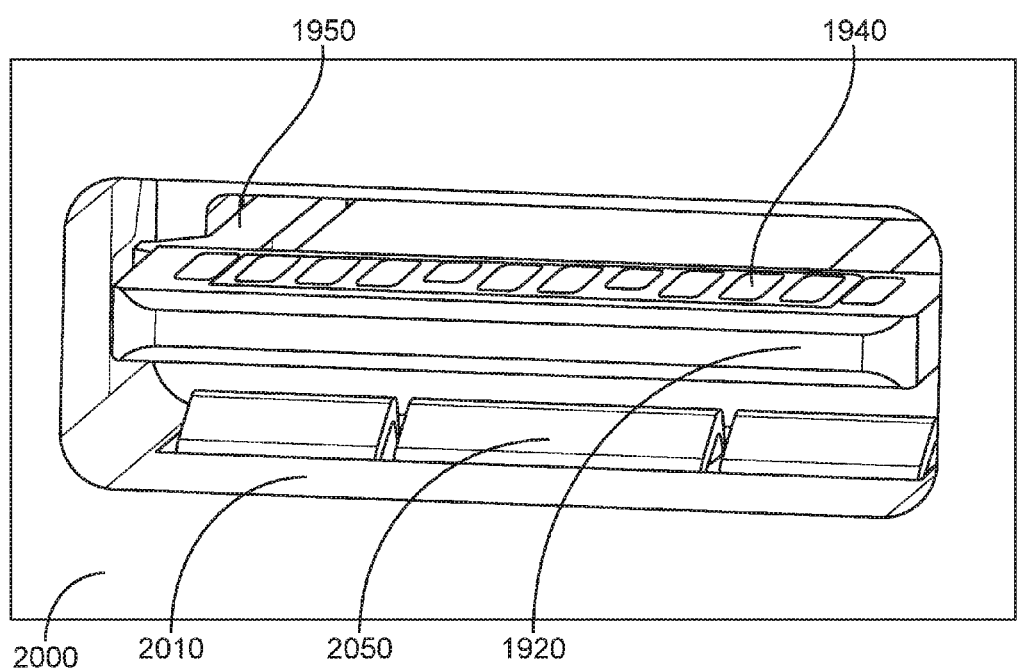
FIG. 20 illustrates an oblique view of the connector receptacle of FIG. 19.

FIG. 20 illustrates an oblique view of the connector receptacle of FIG. 19. Again, side ground contacts 1950 may be located to the sides of narrow portion 1970 of tongue 1920.

By placing side ground contacts 1950 along a narrow portion 1970 of tongue 1920, behind wider portion 1960, the inclusion of side ground contacts 1950 may not significantly degrade the appearance of a connector receptacle.

Side ground contacts 1950 may provide grounding and retention properties. Additional ground contacts 2050 may also be included for extra grounding and retention. These ground contacts 2050 may be located along a top, bottom, or side of an opening 2010 in device enclosure 2000.

Figure 21:
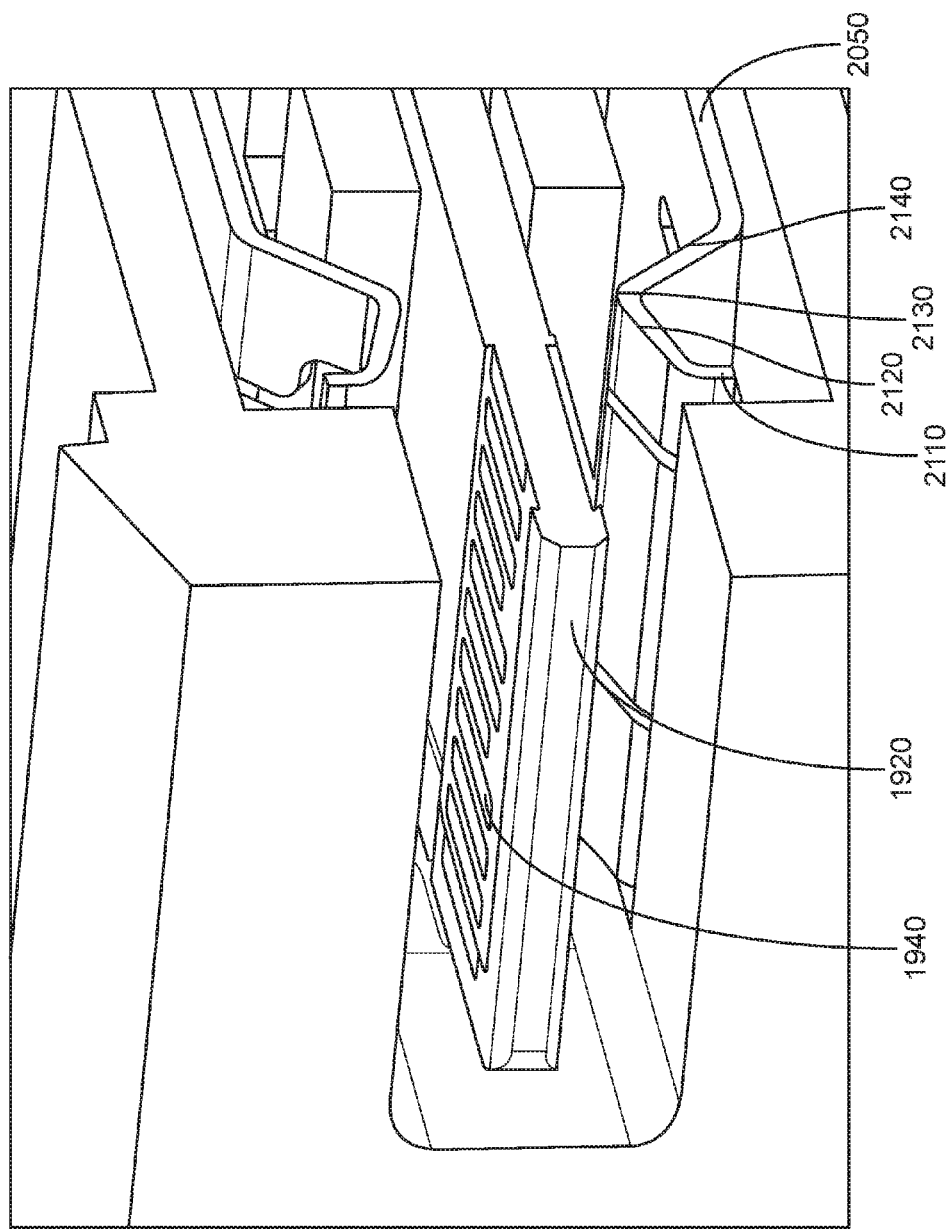
FIG. 21 illustrates a cutaway side view of a connector receptacle FIG. 19.

FIG. 21 illustrates a cutaway side view of a connector receptacle FIG. 19. Again, ground contacts 2050 may be included. These ground contacts may include a substantially flat front edge 2110 leaving to a substantially flat sloping portion 2120, which may terminate in ridge 2130. A back sloping portion 2140 may extend from a ridge to a remainder of the ground contacts 2050. As before, contacts 1940 may be located on tongue 1920. Contacts 2050 may engage a connector insert shield to provide ground and EMI protection.

Figure 22:
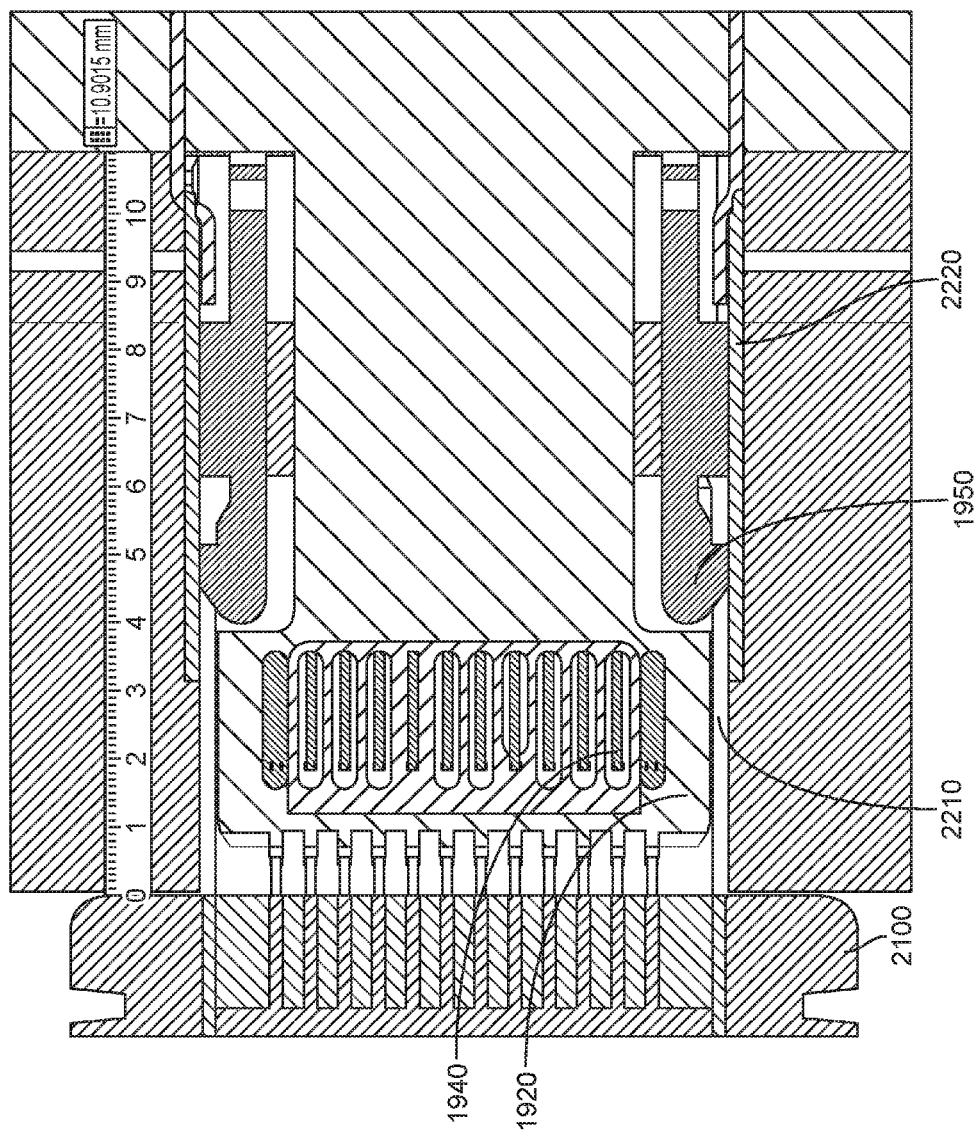
FIG. 22 illustrates the connector receptacle of FIG. 19 when a connector plug is inserted.

FIG. 22 illustrates the connector receptacle of FIG. 19 when a connector plug is inserted. Connector plug 2100 may include shield 2010 having an opening to 2220. Contacting portion 1952 of side ground contacts 1950 may engage or fit in opening 2220 of shield 2210. Again, side ground contacts 1950 may be located along a narrow portion 1970 of tongue 1920. Tongue 1920 may include a wide portion 1960 supporting a number of contacts 1940.

Figure 23:
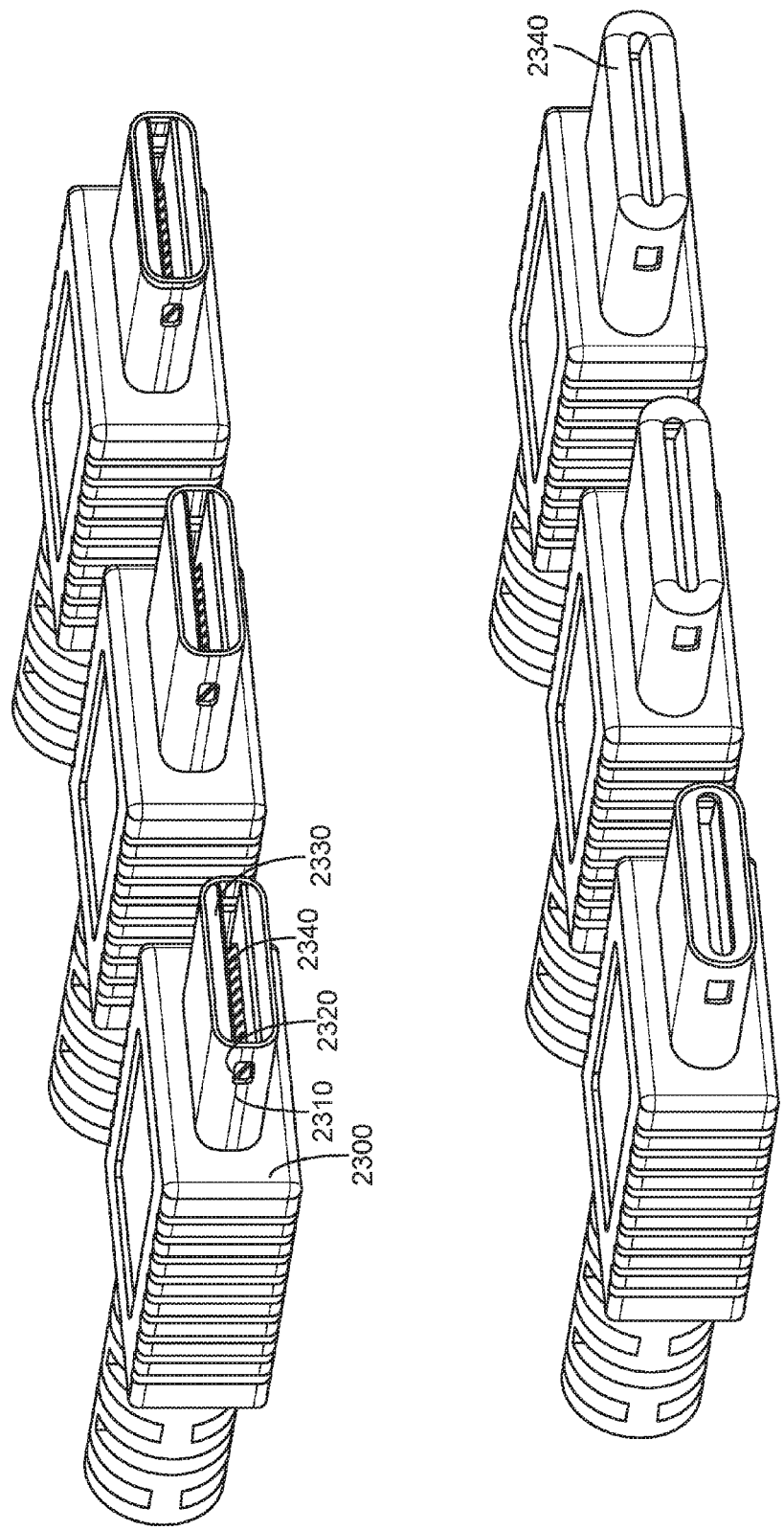
FIG. 23 illustrates a variety of connector inserts which may be provided by embodiments of the present invention.

FIG. 23 illustrates a variety of connector inserts which may be provided by embodiments of the present invention. Connector inserts 2300 may include shield portions 2310 having side openings 2320. Side openings 2320 may be used to engage contacting portions 1952 on side ground contacts 1950. A number of contacts 2340 may be located in housing 2330.

Figure 24:
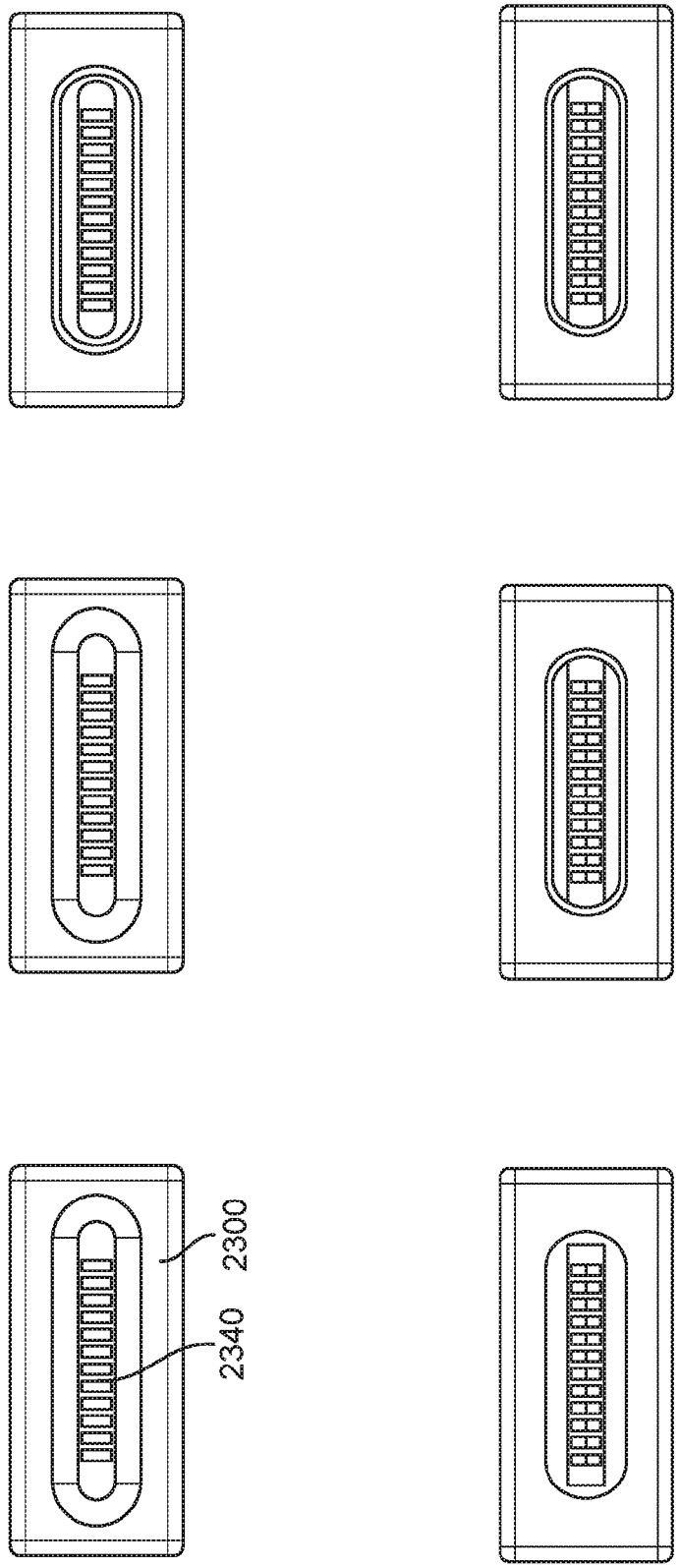
FIG. 24 illustrates a front view of the connector insert of FIG. 23.

FIG. 24 illustrates a front view of the connector insert of FIG. 23. Connector inserts 2300 may include a number of contacts 2340 for forming electrical connections with contacts 1940 on tongue 1920 in a connector receptacle.

Figure 25:
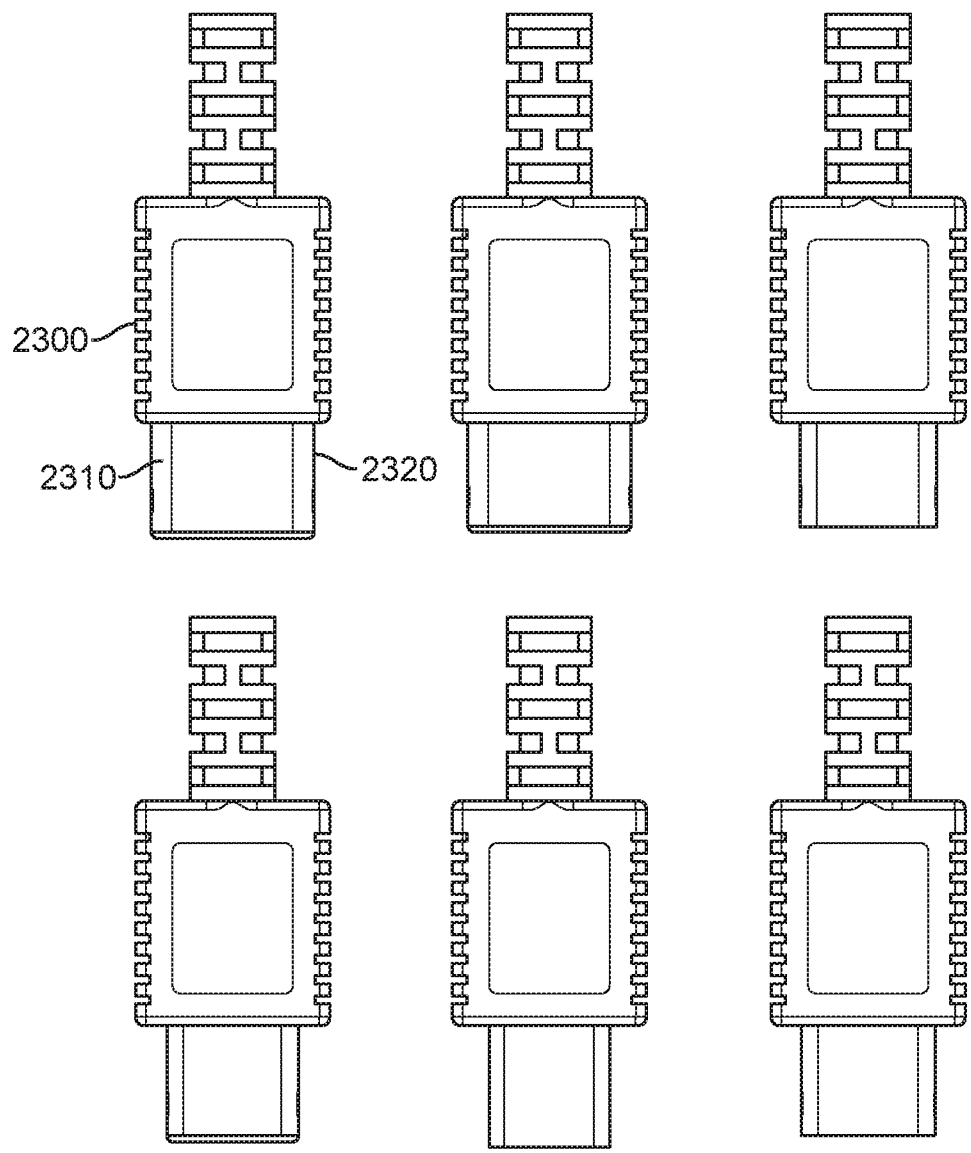
FIG. 25 illustrates a top view of the connector inserts of FIG. 23.

FIG. 25 illustrates a top view of connector inserts according to an embodiment of the present invention. Again, connector inserts 2300 may include a shield 2310 having side openings 2320. Side openings 2320 may correspond to side opening 2220 in FIG. 22.

Again, embodiments of the present invention may provide connector inserts having a front plastic tip. In other embodiments of the present invention, this tip may be metal for increased strength. An example is shown in the following figure.

Figure 26:
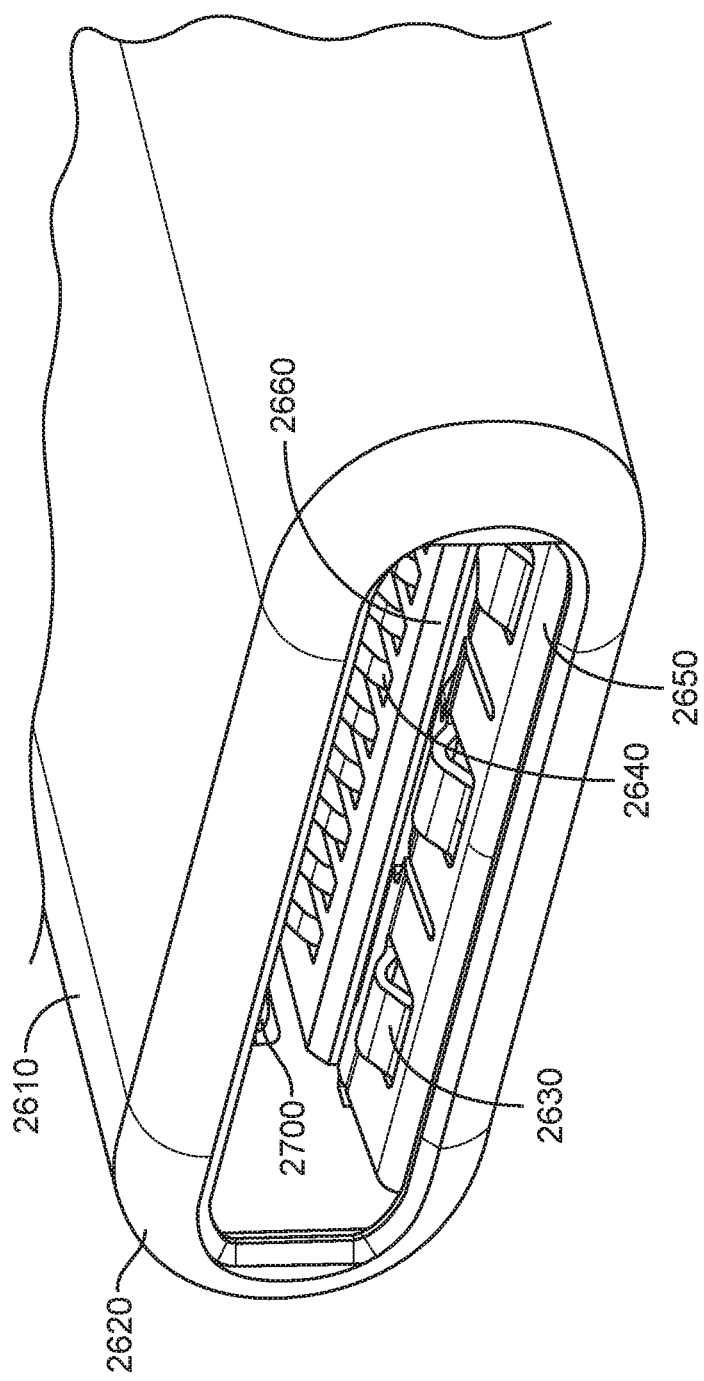
FIG. 26 illustrates a connector insert according to an embodiment of the present invention.

FIG. 26 illustrates a connector insert according to an embodiment of the present invention. This connector insert may include shield 2610, front portion 2620, side retention contact 2700, ground contact 2630, signal contacts 2640, and housing portions 2660 and 2650. Front portion 2620 may be used a front portion on other connector inserts provided by embodiments of the present invention.

Front portion 2620 may be formed integrally with shield 2610. In other embodiments of the present invention, front portion 2620 may be formed separately from shield 2610. In these embodiments, front portion 2620 may be attached to shield 2610, or shield 2610 and front portion 2620 may both be attached to a common structure, such as a housing portion, in the connector insert.

In various embodiments of the present invention, it may be desirable to provide a robust retention force between a connector insert and a connector receptacle when the connector insert is inserted into connector receptacle. It may also be desirable that the retention feature providing this force not provide or rely upon a locking feature. An example of one such retention feature is shown in the following figures.

Figure 27:
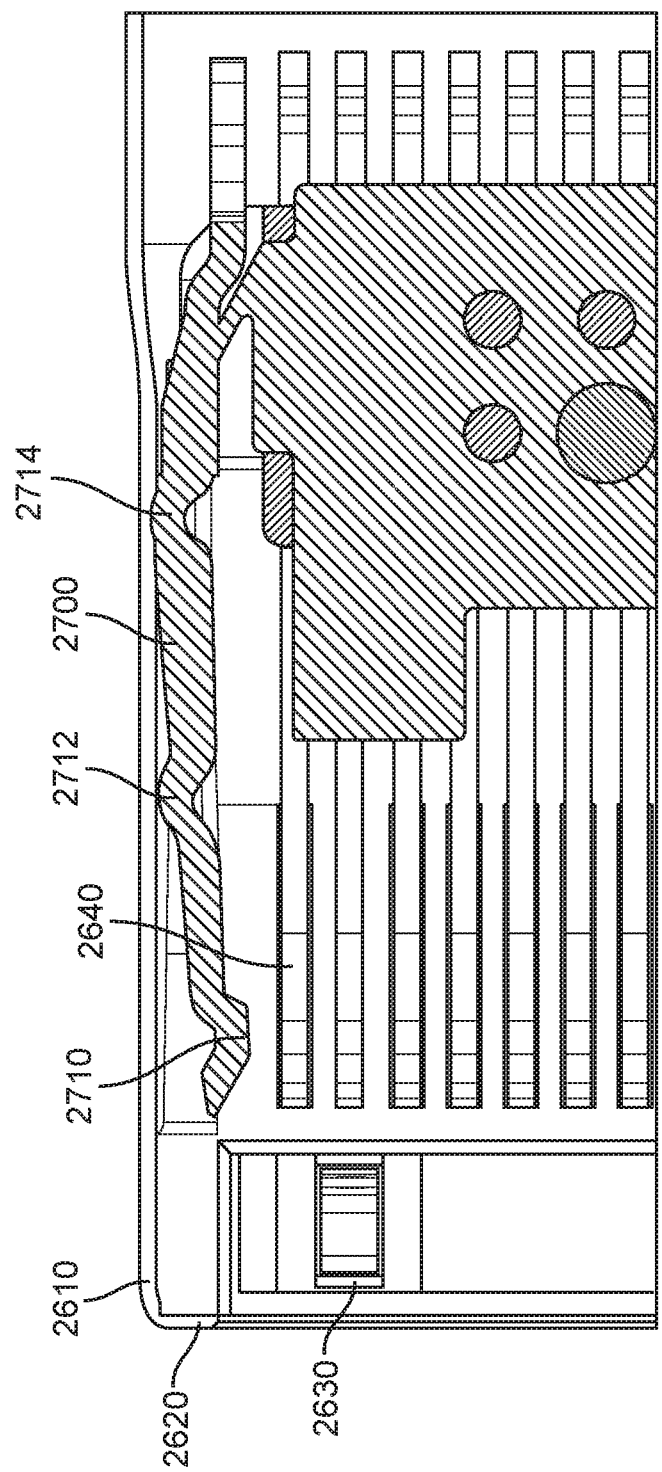
FIG. 27 illustrates a top cross-section view of a portion of a connector insert according to an embodiment of the present invention.

FIG. 27 illustrates a top cross-section view of a portion of a connector insert according to an embodiment of the present invention. This connector insert may include retention spring 2700. Retention spring 2700 may be used as the retention spring in other embodiments of the present invention. In this example, signal contacts 2640 may be located behind ground contact 2630. Shield 2610 may be formed with front portion 2620. Retention spring 2700 may include localized points of concentrated force 2712 and 2714. These localized points may act as inflection points to increase the retention force applied at contact portion 2710 to a notch in a tongue in a connector receptacle. Retention spring 2700 may have a variable shape and thickness along its length to increase its effective retention or holding strength. This is shown further in the following figures.

Figure 28:
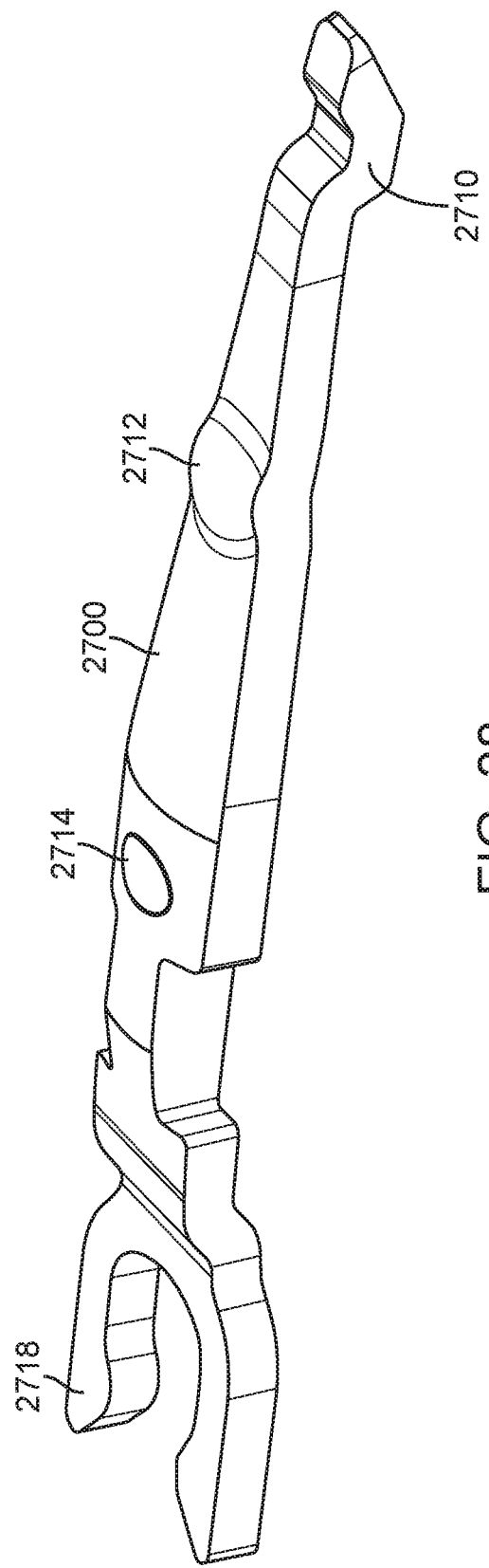
FIG. 28 illustrates a retention spring according to an embodiment of the present invention.

FIG. 28 illustrates a retention spring according to an embodiment of the present invention. Again, retention spring 2700 may include localized points of concentrated force 2712 and 2714. Retention spring 2700 may further include contacting portion 2710 to engage a notch portion of a tongue in a connector receptacle. Retention spring 2700 may further include connecting portion 2718, which may be connected to ground.

Figure 29:
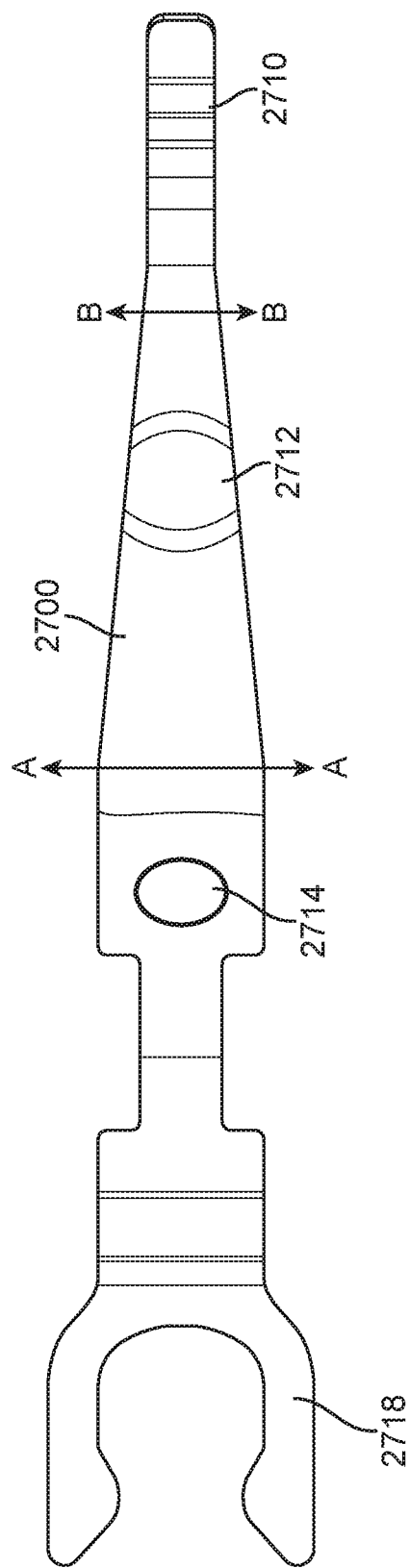
FIG. 29 illustrates a top view of a retention spring according to an embodiment of the present invention.

FIG. 29 illustrates a top view of a retention spring according to an embodiment of the present invention. Again, retention spring 2700 may include localized points of concentrated force 2712 and 2714, as well as contacting portion 2710 and 2718.

As shown, a width of the retention spring may narrow towards contacting end and contacting portion 2710. Specifically, a width along line A-A may be greater than a width along line B-B. A similar principle may be applied along the cross-section of retention spring 2700. Examples are shown in the following figures.

Figure 30:
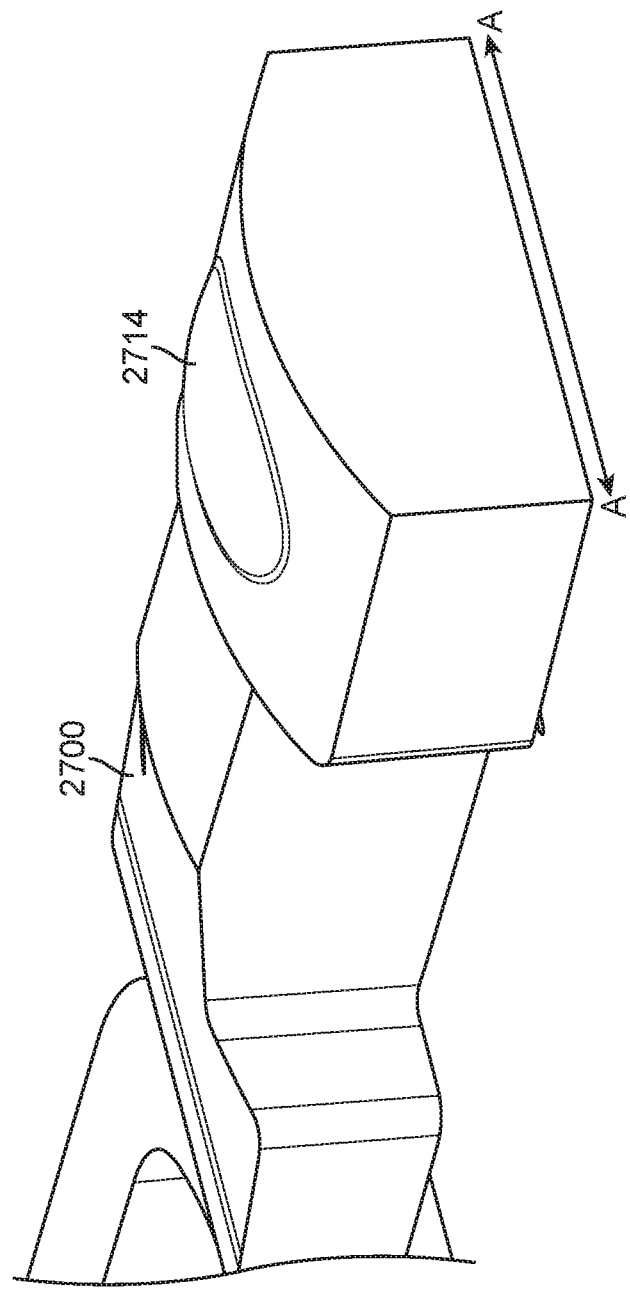
FIG. 30 illustrates a cross-section of a retention spring according to an embodiment of the present invention.

FIG. 30 illustrates a cross-section of a retention spring according to an embodiment of the present invention. At cross-section A-A, a top of retention spring 2700 may be curved. This curved shape may efficiently increase a holding strength of the retention spring. The use of a variable thickness and a curved surface may efficiently increase a holding strength of retention spring 2700 for a given size.

Figure 31:
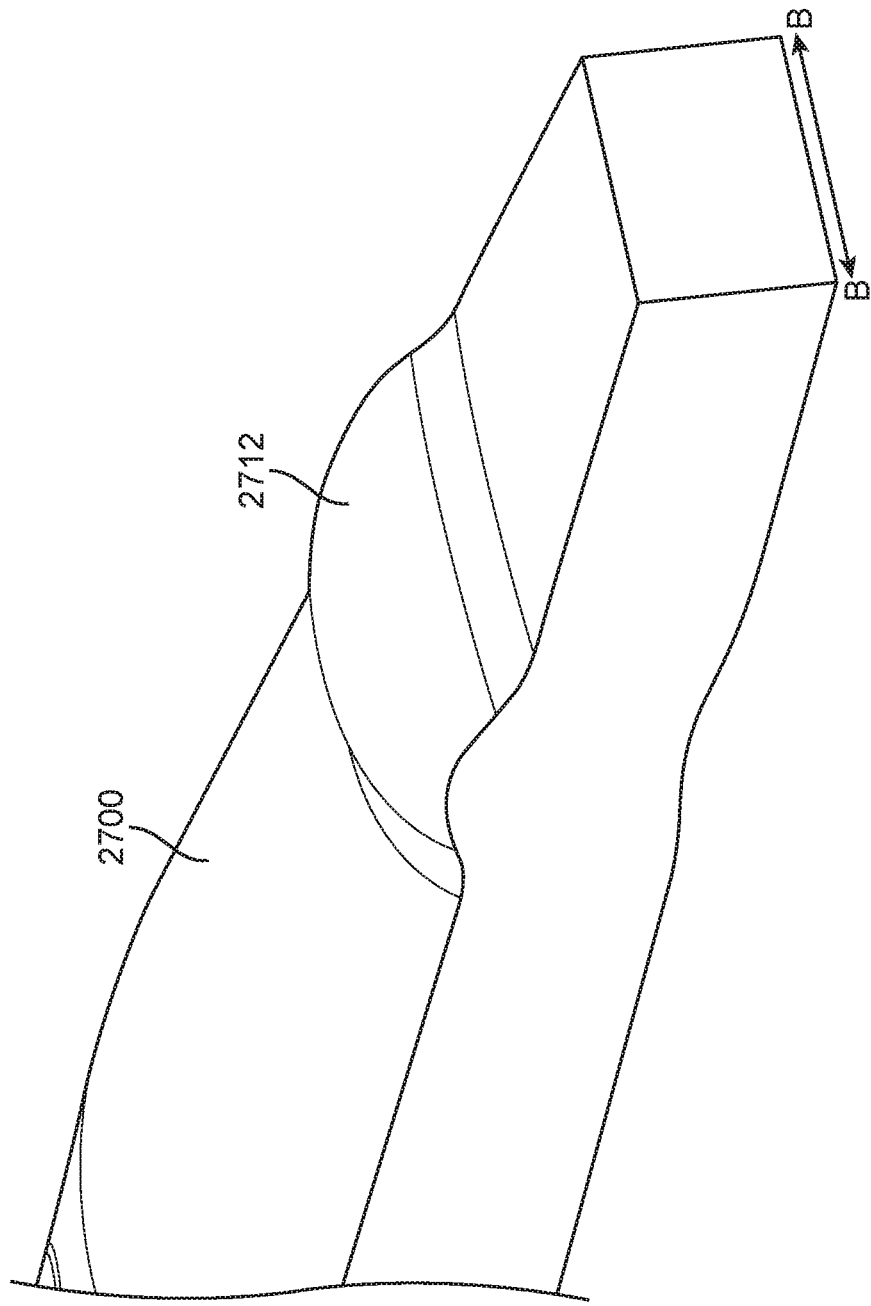
FIG. 31 illustrates another cross-section of a retention spring according to an embodiment of the present invention.

FIG. 31 illustrates another cross-section of a retention spring according to an embodiment of the present invention. At cross-section B-B, retention spring 2700 may be considerably narrower and have a uniform thickness as it approaches a contacting portion.

Figure 32:
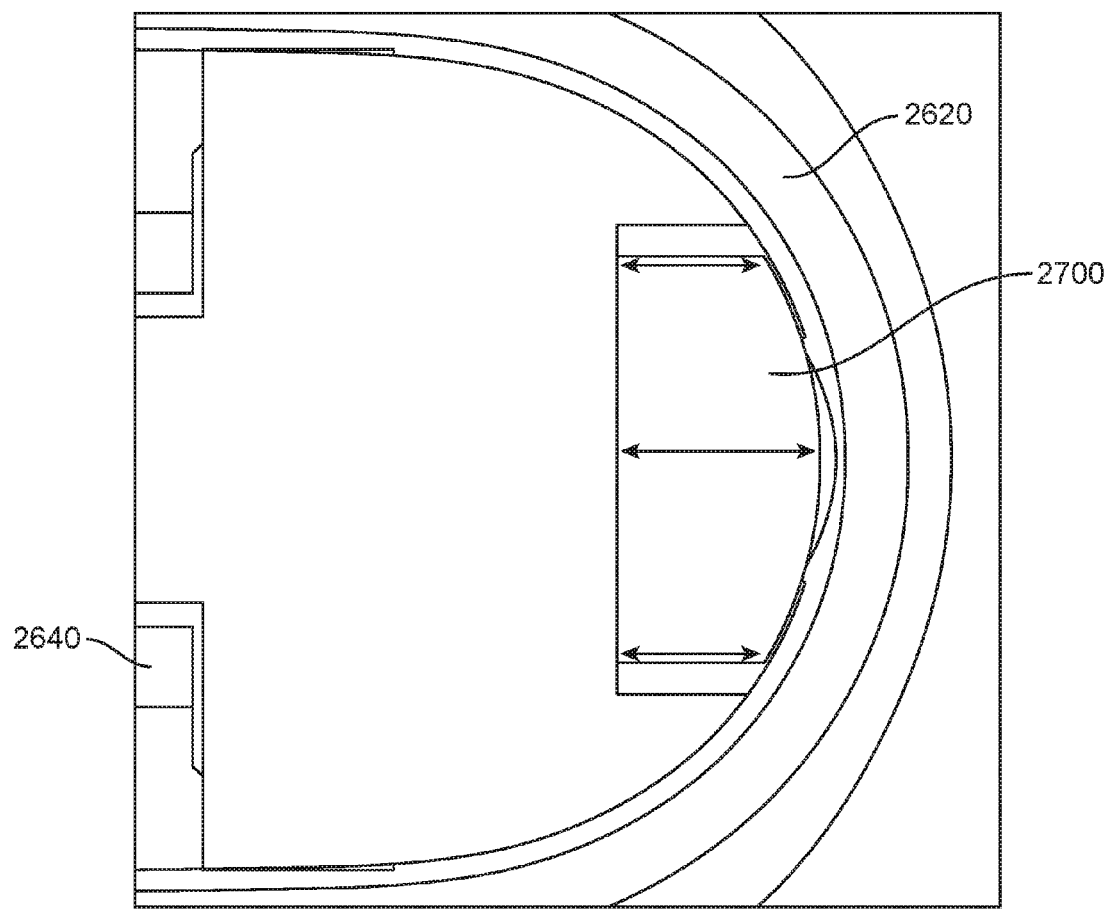
FIG. 32 illustrates a portion of a front of a connector insert according to an embodiment of the present invention.

FIG. 32 illustrates a portion of a front of a connector insert according to an embodiment of the present invention. As seen from its end, retention spring 2700 consumes only a limited area and takes advantage of the curved surface of the opening formed by front portion 2620. This arrangement may allow retention spring 2700 to provide a strong effective retention force while consuming only a small portion of a front profile of a connector insert.

Again, embodiments of the present invention may provide receptacle tongues that are formed using one or more printed circuit board technologies. More specifically, embodiments of the present invention may provide receptacle tongues that are formed using printed circuit boards. In various embodiments of the present invention, these printed circuit boards may be a portion of a larger printed circuit board. Examples are shown in the following figures.

Figure 33:
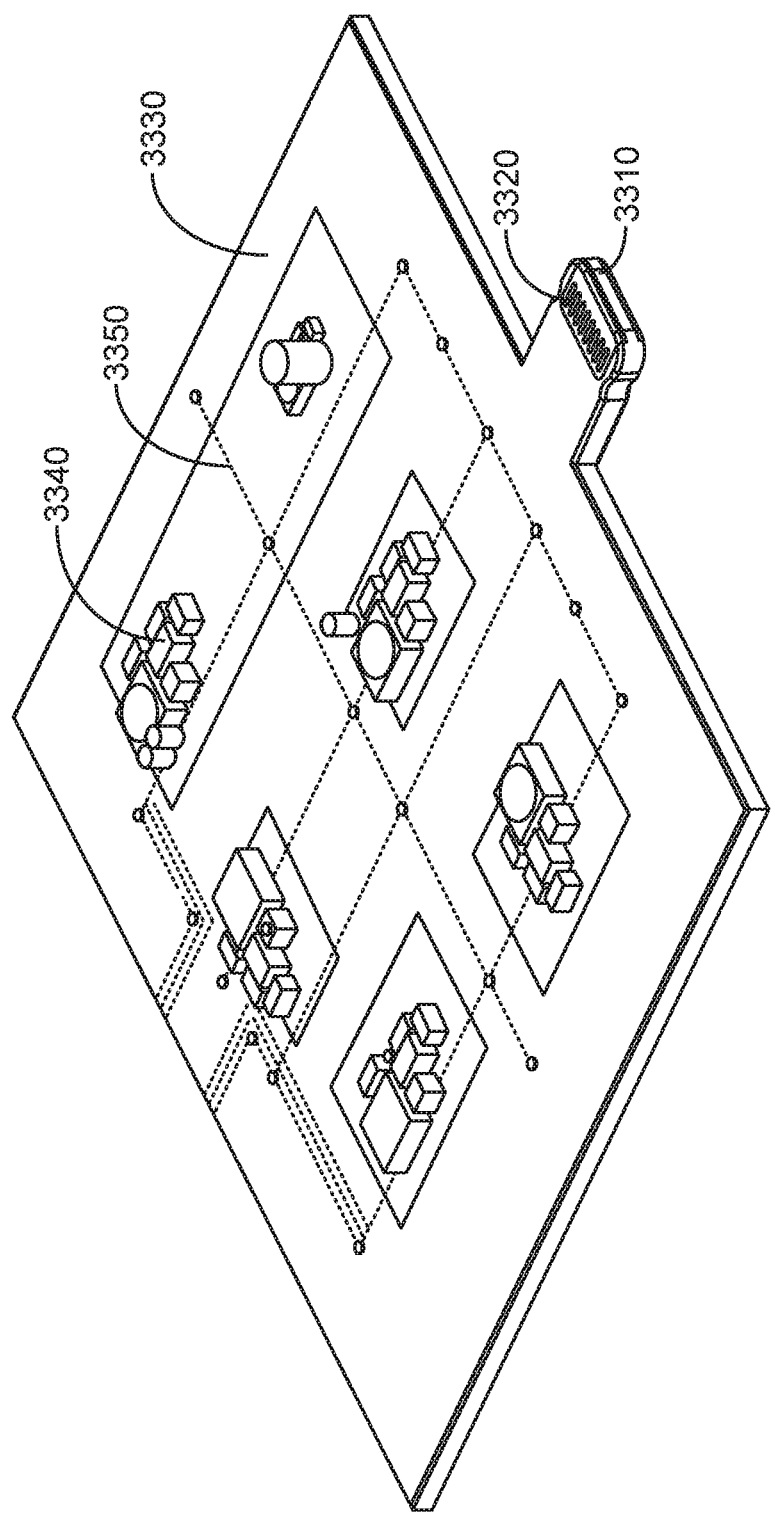
FIG. 33 illustrates a printed circuit board including a tongue portion for a connector receptacle according to an embodiment of the present invention.

FIG. 33 illustrates a printed circuit board including a tongue portion for a connector receptacle according to an embodiment of the present invention. Printed circuit board 3330 may include circuits 3340 connected to each other by traces 3550. A tongue portion 3310 may extend from a side of printed circuit board 3330. Tongue portion 3310 may include a number of contacts 3320. Contacts 3320 may connect to traces 3350 on printed circuit board 3330.

Figure 34:
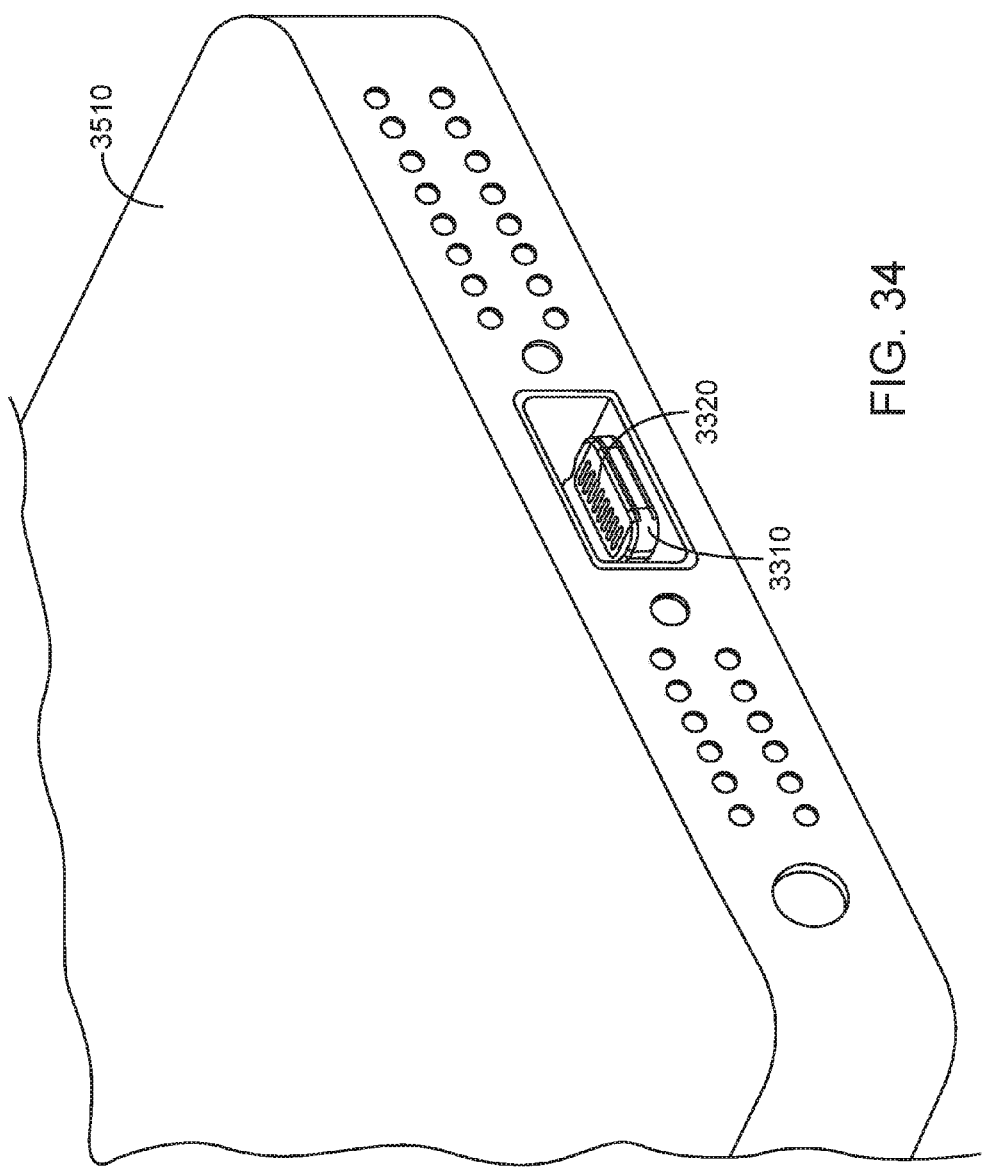
FIG. 34 illustrates an electronic device that includes the printed circuit board of FIG. 33.

FIG. 34 illustrates an electronic device that includes the printed circuit board of FIG. 33. This electronic device may be housed an enclosure 3510. Tongue 3310 may be located in an opening in the device enclosure 3510. Contacts 3320 may be located on printed circuit board 3310.

Again, embodiments of the present invention may provide connector receptacles having very thin tongues. When a plug is extracted, spring type signal contacts in a top row of the plug may engage spring type signal contacts in a bottom row of the plug. To prevent this from causing damage, power pins in one row may be arranged such that they are not aligned with ground pins in the other row. A pinout providing this is shown in the following figure.

FIG. 35 illustrates a pinout for a connector receptacle according to embodiments the present invention. This pinout may support a universal connector that may provide and receive signals for more than one standard or proprietary interface. In this example, P may be power, G may be ground, RX and TX may be differential signal lines, while the LS lines are control lines.

FIG. 36 illustrates a pinout for another connector receptacle according to embodiments the present invention. This pinout may support a universal connector that may provide and receive signals for more than one standard or proprietary interface. In this example, G may be ground, HVP may be power, the HS pins may carry differential signal pairs, USB may convey USB signals, while RFU and C signals are control or other similar signals.

Figure 37:
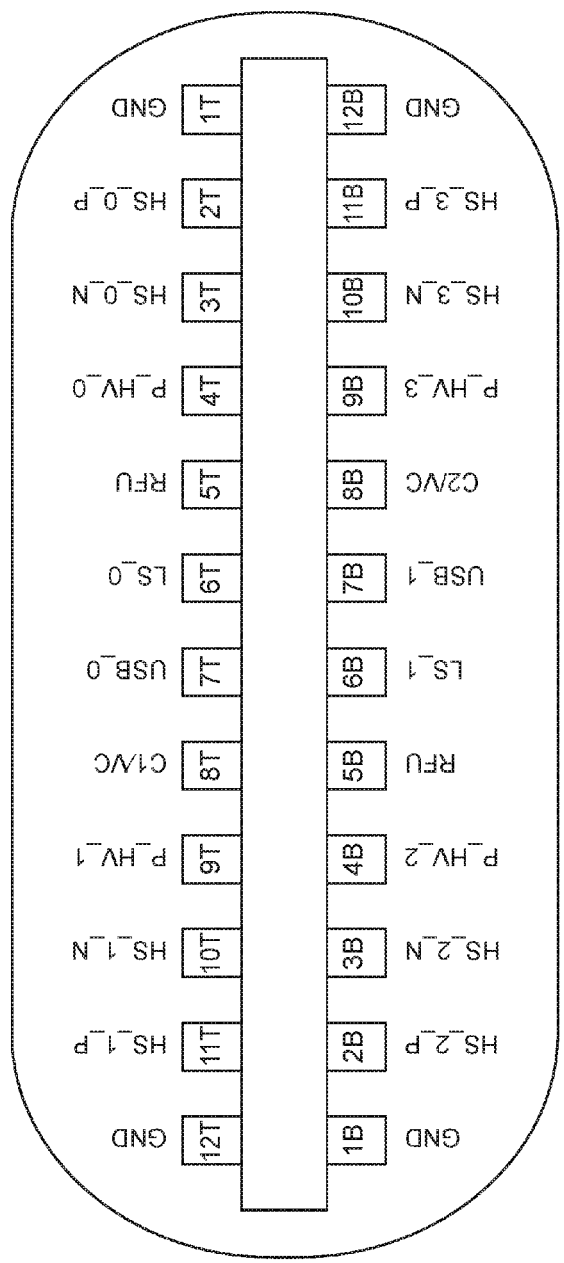
FIG. 37 illustrates a mapping of pins for various types of interfaces to pins of a connector receptacle according to an embodiment of the present invention.

FIG. 37 illustrates a mapping of pins for various types of interfaces to pins of a connector receptacle according to an embodiment of the present invention. In this example, mappings for DisplayPort and HDMI, for receiving and transmitting (sink and source), power chargers, and USB interfaces are shown.

In various embodiments of the present invention, contacts and other conductive portions of connector inserts and receptacles may be formed by stamping, metal-injection molding, machining, micro-machining, 3-D printing, or other manufacturing process. The conductive portions may be formed of stainless steel, steel, copper, copper titanium, phosphor bronze, or other material or combination of materials. They may be plated or coated with nickel, gold, or other material. The nonconductive portions may be formed using injection or other molding, 3-D printing, machining, or other manufacturing process. The nonconductive portions may be formed of silicon or silicone, rubber, hard rubber, plastic, nylon, liquid-crystal polymers (LCPs), or other nonconductive material or combination of materials. The printed circuit boards used may be formed of FR-4, BT or other material. Printed circuit boards may be replaced by other substrates, such as flexible circuit boards, in many embodiments of the present invention.

Embodiments of the present invention may provide connector inserts and receptacles that may be located in, and may connect to, various types of devices, such as portable computing devices, tablet computers, desktop computers, laptops, all-in-one computers, wearable computing devices, cell phones, smart phones, media phones, storage devices, portable media players, navigation systems, monitors, power supplies, adapters, remote control devices, chargers, and other devices. These connector inserts and receptacles may provide pathways for signals that are compliant with one or more various standards such as Universal Serial Bus (USB) including USB-C, a High-Definition Multimedia Interface (HDMI), Digital Visual Interface (DVI), power, Ethernet, DisplayPort, Thunderbolt, Lightning and other types of standard and non-standard interfaces that have been developed, are being developed, or will be developed in the future. Other embodiments of the present invention may provide connector inserts and receptacles that may be used to provide a reduced set of functions for one or more of these standards. In various embodiments of the present invention, these interconnect paths provided by these connector inserts and receptacles may be used to convey power, ground, signals, test points, and other voltage, current, data, or other information.

The above description of embodiments of the invention has been presented for the purposes of illustration and description. It is not intended to be exhaustive or to limit the invention to the precise form described, and many modifications and variations are possible in light of the teaching above. The embodiments were chosen and described in order to best explain the principles of the invention and its practical applications to thereby enable others skilled in the art to best utilize the invention in various embodiments and with various modifications as are suited to the particular use contemplated. Thus, it will be appreciated that the invention is intended to cover all modifications and equivalents within the scope of the following claims.

What is claimed is:

1. An electronic device comprising:
a device enclosure housing at least a portion of the electronic device;
a connector receptacle comprising:
a recess in the device enclosure, the recess having a front opening to allow insertion of a corresponding connector insert, the recess having a rear opening in a rear wall, the rear wall opposite the front opening;
a tongue supporting a first plurality of contacts on a top surface and a second plurality of contacts on a bottom surface, the tongue extending through the rear opening and into the recess;
a top ground plate on the top surface of the tongue;

a bottom ground plate on the bottom surface of the tongue; and a collar around the tongue and securing the top ground plate and the bottom ground plate in place relative to the tongue.

2. The electronic device of claim 1 wherein the tongue is a printed circuit board.

3. The electronic device of claim 1 wherein the tongue is a portion of a printed circuit board for the electronic device.

4. The electronic device of claim 1 wherein the top ground plate extends from the collar towards the front opening and away from the top surface of the tongue to a ridge, then further extends towards the top surface of the tongue.

5. The electronic device of claim 4 wherein the bottom ground plate extends from the collar towards the front opening and away from the bottom surface of the tongue to a ridge, then further extends towards the bottom surface of the tongue.

6. The electronic device of claim 5 wherein the top ground plate and the bottom ground plate extend through the rear opening.

7. The electronic device of claim 6 wherein the collar is on a first side of the rear opening and the recess is on a second side of the rear opening.

8. The electronic device of claim 1 wherein the rear wall is integrally formed with the device enclosure.

9. An electronic device comprising:
a device enclosure housing at least a portion of the electronic device;
a connector receptacle comprising:
a recess in the device enclosure, the recess having a front opening to allow insertion of a corresponding connector insert, the recess having a rear opening in a rear wall, the rear wall opposite the front opening;
a tongue supporting a first plurality of contacts on a top surface and a second plurality of contacts on a bottom surface, the tongue extending through the rear opening and into the recess; and
a ground shield partially around the tongue and forming a top ground contact on a top surface of the tongue and a bottom ground contact on a bottom surface of the tongue,
wherein the top ground contact and the bottom ground contact extend through the rear opening in the rear wall.

10. The electronic device of claim 9 wherein the tongue is a printed circuit board.

11. The electronic device of claim 9 wherein the tongue is a portion of a printed circuit board for the electronic device.

12. The electronic device of claim 9 wherein a leading edge of the tongue is chamfered.

13. The electronic device of claim 9 wherein the ground shield is adjacent to the top surface, bottom surface, and sides of the tongue.

14. The electronic device of claim 9 wherein the rear wall is integrally formed with the device enclosure.

15. An electronic device comprising:
a device enclosure housing at least a portion of the electronic device;
a connector receptacle comprising:
a recess in the device enclosure, the recess having a front opening to allow insertion of a corresponding connector insert, the recess having a rear opening in a rear wall, the rear wall opposite the front opening;
a tongue having a wide front portion towards the front opening, the wide front portion supporting a first plurality of contacts on a top surface and a second plurality of contacts on a bottom surface, the tongue having a narrow rear portion behind the wide front portion and extending through the rear opening and into the recess;
a first side ground contact attached to a first side of the tongue and extending parallel with the narrow rear portion of the tongue and towards the front opening, the first side ground contact having a contacting portion between the wide front portion and the rear opening; and
a second side ground contact attached to a second side of the tongue, the second side opposite the first side, the first and second sides joining the top surface and the bottom surface, the second side ground contact extending parallel with the narrow rear portion of the tongue and towards the front opening, the second side ground contact having a contacting portion between the wide front portion and the rear opening.

16. The electronic device of claim 15 wherein the tongue is a printed circuit board.

17. The electronic device of claim 16 wherein the first and second side ground contacts are formed with the tongue.

18. The electronic device of claim 16 wherein the first and second side ground contacts are formed separately from the tongue.

19. The electronic device of claim 16 wherein the tongue has a major axis extending in a lateral direction, and the first side of the tongue and the second side of the tongue are laterally displaced from each other.

20. The electronic device of claim 15 wherein the tongue is a portion of a printed circuit board for the electronic device.

21. The electronic device of claim 15 further comprising:
a top ground contact having a substantially flat front edge leading to a substantially flat sloping portion terminating in a ridge and further comprising a back sloping portion; and
a bottom ground contact having a substantially flat front edge leading to a substantially flat sloping portion terminating in a ridge and further comprising a back sloping portion.

22. The electronic device of claim 15 wherein the rear wall is integrally formed with the device enclosure.

* * * * *